(12) United States Patent	(10) Patent No.: US 8,421,546 B2
Sugama et al.	(45) Date of Patent: Apr. 16, 2013

(54) PIEZOELECTRIC VIBRATOR, OSCILLATOR, ELECTRONIC EQUIPMENT TIMEPIECE, AND RADIO-CONTROLLED TIMEPIECE, AND METHOD OF MANUFACTURING PIEZOELECTRIC VIBRATOR

(75) Inventors: Kazuyoshi Sugama, Chiba (JP); Kyoshi Aratake, Chiba (JP); Masashi Numata, Chiba (JP)

(73) Assignee: Seiko Instruments Inc., Chiba (JP)

( * ) Notice: Subject to any disclaimer, the term of this patent is extended or adjusted under 35 U.S.C. 154(b) by 260 days.

(21) Appl. No.: 13/035,490

(22) Filed: Feb. 25, 2011

(65) Prior Publication Data

US 2011/0193646 A1    Aug. 11, 2011

Related U.S. Application Data

(63) Continuation of application No. PCT/JP2008/065252, filed on Aug. 27, 2008.

(51) Int. Cl.
*H03B 5/32* (2006.01)
*H01L 41/00* (2006.01)
*H03H 9/24* (2006.01)

(52) U.S. Cl.
USPC ........... 331/156; 331/158; 333/200; 310/370; 29/25.35

(58) Field of Classification Search .................. 331/156, 331/158; 333/200; 310/370, 348; 29/25.35
See application file for complete search history.

(56) References Cited

U.S. PATENT DOCUMENTS

| 2005/0082653 | A1  | 4/2005 | McWilliams et al. |
| 2007/0188055 | A1* | 8/2007 | Kuwahara ...................... 310/370 |
| 2008/0054763 | A1* | 3/2008 | Kizaki ........................... 310/370 |

FOREIGN PATENT DOCUMENTS

| JP | 61-066303 A  | 4/1986 |
| JP | 03-055893 A  | 3/1991 |
| JP | 08-148797 A  | 6/1996 |
| JP | 2002-121037 A | 4/2002 |
| JP | 2002-124845 A | 4/2002 |
| JP | 2004-266763 A | 9/2004 |
| JP | 2006-279872 A | 10/2006 |
| JP | 2007-013636 A | 1/2007 |

OTHER PUBLICATIONS

International Search Report for International Application No. PCT/JP2008/065252, dated Nov. 25, 2008, 2 pages.

* cited by examiner

*Primary Examiner* — Joseph Chang
(74) *Attorney, Agent, or Firm* — Brinks Hofer Gilson & Lione

(57) ABSTRACT

A piezoelectric vibrator according to the invention includes a base substrate and a lid substrate which are connected to each other and have a cavity formed therebetween; a piezoelectric vibrating reed that is mounted on the base substrate in the cavity; an external electrode that is formed on a lower surface of the base substrate; and a through electrode which is formed so as to pass through the base substrate, maintain the airtightness in the cavity, and electrically connect the piezoelectric vibrating reed with the external electrode. The through electrode is formed by a press molding by a forming mold having a pin, and includes a through hole of a taper-shaped section, in which a taper angle is in the range of 15° or more and 20° or less, and a conductive paste that is hardened after being filled in the through hole.

5 Claims, 19 Drawing Sheets

PIEZOELECTRIC VIBRATOR, OSCILLATOR, ELECTRONIC EQUIPMENT TIMEPIECE, AND RADIO-CONTROLLED TIMEPIECE, AND METHOD OF MANUFACTURING PIEZOELECTRIC VIBRATOR

RELATED APPLICATIONS

This application is a continuation of PCT/JP2008/065252 filed on Aug. 27, 2008. The entire contents of these applications are incorporated herein by reference.

TECHNICAL FIELD

The present invention relates to a Surface Mount Device type (SMD) piezoelectric vibrator in which a piezoelectric vibrating reed is sealed in a cavity formed between two bonded substrates, a piezoelectric manufacturing method to manufacture the piezoelectric vibrator, an oscillator, electronic equipment and a radio-controlled timepiece having the piezoelectric vibrator.

BACKGROUND ART

In recent years, piezoelectric vibrators using crystals or the like have been used in mobile phones or personal digital assistants, as a time source or a timing source such as a control signal, or a reference signal source and the like. Various types of piezoelectric vibrators are known, but an SMD type piezoelectric vibrator is known as one. With this type of piezoelectric vibrator, generally, a three layer structure type, in which piezoelectric substrates formed with a piezoelectric vibrating reed are bonded so as to be pinched from above and below by a base substrate and a lid substrate, is known. In this case, the piezoelectric vibrator is received in a cavity (a sealing chamber) formed between the base substrate and the lid substrate. Furthermore, recently, a two layer structure type has also been developed instead of the three layer structure type.

This type of piezoelectric vibrator has the two layer structure, in which the base substrate and the lid substrate are directly bonded to each other and the piezoelectric vibrating reed is accommodated within the cavity formed between both substrates.

The piezoelectric vibrator of a two layer structure is excellent in that thinning can be promoted as compared to the three layer structure and is preferentially used. As the two layer structure type piezoelectric vibrator, a piezoelectric vibrator, in which the piezoelectric vibrating reed is electrically connected to an external electrode formed on a base substrate using a conductive member formed so as to pass through the base substrate, is known (see Patent Documents 1 and 2).

However, as shown in FIGS. 26 and 27, a piezoelectric vibrator 200 includes a base substrate 201 and a lid substrate 202 which are anode-bonded to each other via a bonding film 207, and a piezoelectric vibrating reed 203 sealed in a cavity C formed between both substrates 201 and 202.

The piezoelectric vibrating reed 203 is, for example, a tuning fork type vibrating reed, and is mounted on an upper surface of the base substrate 201 in the cavity C via a conductive adhesive E. The base substrate 201 and the lid substrate 202 are insulation substrates that are formed of, for example, ceramic, glass or the like. On the base substrate 201 of both substrates 201 and 202, a through hole 204 passing through the substrate 201 is formed. Moreover, in the through hole 204, a conductive member 205 is buried to block the through hole 204. The conductive member 205 is electrically connected to the external electrode 206 formed on the lower surface of the base substrate 201 and is electrically connected to the piezoelectric vibrating reed 203 mounted in the cavity C.

However, in the above-mentioned two layer structure type piezoelectric vibrator, the conductive member is formed by filling a conductive paste (Ag paste, Au—Sn paste or the like) in the through hole. At this time, in order to reliably block the through hole to maintain the airtightness in the cavity and electrically connect the piezoelectric vibrating reed with the external electrode to secure a reliable conductivity, there is a need to stably fill the conductive paste in the through hole.

For that reason, the formation of the through hole becomes a crucial process.

Generally, as a method of forming the through hole, a method of mechanically drilling using a drill, a method of drilling by laser irradiation, a method of drilling by sand blasting or the like are known.

However, when the through hole is formed using the drill, since the formation state of the through hole depends on the condition (sharpness or the like) of the drill, an irregularity in quality can occur easily. Furthermore, an inner peripheral surface can be easily roughened, whereby it is difficult to finish a flat surface. For that reason, it is difficult to stably fill the conductive paste and the reliability of the airtightness deteriorates. In addition, since a plurality of through holes is usually formed in a wafer step, in the case of using the drill, it takes a long time and is inefficient.

Furthermore, in the case of forming the through hole using a laser beam, since it is affected by a laser beam and a deformed layer is generated in the inner peripheral surface, it is an undesirable method.

Moreover, in the case of forming the through hole by sand blasting, inevitably, the inner peripheral surface is easily roughened depending on the manufacturing method and it is difficult to finish the inner peripheral surface to a flat surface. For that reason, it is difficult to stably fill the conductive paste and the reliability of the airtightness deteriorates.

Herein, as another method of forming the through hole, as shown in Patent Document 1, a method of forming the through hole by press molding using a forming mold while heating the base substrate is known. According to the method, it is possible to accurately form through holes in a uniform quality at a time and finish the inner peripheral surface to a flat surface. Thus, the conductive paste can stably be filled and the reliability of the airtightness can be secured.

Accordingly, this method is superior to other methods in the formation of the through hole.

[Patent Citation 1] JP-A-2002-124845
[Patent Citation 2] JP-A-2006-279872

However, in the method of forming the through hole by press molding, the following problem remains.

Firstly, after the press molding, when separating the forming mold and the base substrate from each other, there is a chance that a pin of the forming mold for forming the through hole is not easily pulled out, whereby the pin can be deformed or bent. Furthermore, since the pin is not easily pulled out, there is a chance that the load is applied to the through hole side and a scratch is generated in the inner peripheral surface of the through hole, whereby a decline in quality occurs.

Furthermore, since the pin of the forming mold is formed in the shape of a taper in which the diameter is gradually narrowed toward the front end thereof to facilitate the press, the through hole is also formed in the shape of a taper. Thus, the diameter of the opening of the through hole can easily become larger as compared to the case of the straight method. Thus, it is difficult to miniaturize the through electrode itself.

However, along with the recent miniaturization of electronic equipment, even with regard to the piezoelectric vibrator mounted on various electronic equipment, further new miniaturization is required in the future. However, when the miniaturization of the through electrode itself is difficult, it is difficult to miniaturize the size of the piezoelectric vibrator, and it has been difficult to respond to the above-mentioned needs.

The present invention has been made in view of the above circumstances, and an object thereof is to provide a piezoelectric vibrator that can be manufactured by the press molding without affecting the pin of the forming mold and that has a through electrode having a high airtightness and in which miniaturization is promoted.

Furthermore, another object thereof is to provide an oscillator, electronic equipment and a radio-controlled timepiece having the piezoelectric vibrator, and a method of manufacturing the piezoelectric vibrator.

SUMMARY OF THE INVENTION

The present invention provides the following means to solve the above-mentioned problem and achieve the related object:

(1) According to the invention there is provided a method of manufacturing a plurality of piezoelectric vibrators, in which a piezoelectric vibrating reed is sealed in a cavity formed between a base substrate and a lid substrate bonded to each other, while using a base substrate wafer and a lid substrate wafer, including:

a setting process in which after preparing a forming mold having a lower mold and an upper mold having a pin which protrudes toward the lower mold and a taper-shaped section in which a taper angle is within a range of 15° or more and 20° or less, the base substrate wafer is set between the lower mold and the upper mold; a pressing process in which the upper mold and the lower mold are press-molded in a state in which the base substrate wafer is heated to a predetermined temperature and is softened, and a through hole is formed in the base substrate wafer using the pin; a baking process in which, after the base substrate wafer is subjected to cooling solidification, the through hole is blocked by burying the conductive paste in the through hole and then the conductive paste is baked to a predetermined temperature and is hardened, thereby forming a through electrode with a taper-shaped section; a mounting process in which the piezoelectric vibrating reed is bonded to the upper surface of the base substrate wafer so as to be electrically connected to the through electrode; a bonding process in which the base substrate wafer and the lid substrate wafer are overlapped and bonded with each other, thereby sealing the piezoelectric vibrating reed in the cavity; an external electrode forming process in which an external electrode is formed on a lower surface of the base substrate wafer so as to be electrically connected to the through electrode; and a cutting process in which both of the bonded wafers are cut to form a plurality of small pieces of the piezoelectric vibrators.

According to the manufacturing method, firstly, the setting process, the pressing process, and the baking process are performed to form the through electrode on the base substrate wafer. The respective processes will be explained in detail.

Firstly, the forming mold including the lower mold and the upper mold having a pin protruding toward the lower mold is prepared. At this time, the pin of the upper mold has a taper-shaped section in which the diameter thereof is gradually shortened toward the front end thereof, and has a taper angle that is within the range of 15° or more and 20° or less.

Moreover, the base substrate wafer is set between the lower mold and the upper mold. After the setting process is finished, in the state where the base substrate wafer is heated to a predetermined temperature and is softened, the base substrate wafer is subjected to press molding by the upper mold and the lower mold. As a result, it is possible to form the through hole having a taper-shaped section in the base substrate wafer using the pin of the upper mold. After the pressing process is finished, the base substrate wafer is subjected to cooling solidification, and then the lower mold and the upper mold are detached from each other. Moreover, the conductive paste is filled in the through hole of the base substrate wafer to block the through hole. Additionally, the buried conductive paste is heated at a predetermined temperature and is hardened. By performing the baking process, it is possible to form the through electrode with a taper-shaped section passing through the base substrate wafer.

Next, after forming the through electrode, the mounting process of bonding the piezoelectric vibrating reed on the upper surface of the base substrate wafer so as to be electrically connected to the through electrode is performed. After the process is finished, the base substrate wafer and the lid substrate wafer are overlapped with each other. As a result, the piezoelectric vibrating reed is placed in the cavity formed between both wafers. Furthermore, both of the overlapped wafers are bonded to each other. By performing the process, both wafers are strongly brought into close contact with each other, which can seal the piezoelectric vibrating reed in the cavity.

Next, the external electrode forming process of forming the external electrode on the lower surface of the base substrate wafer so as to be electrically connected to the through electrode is performed. By this process, the piezoelectric vibrating reed is electrically connected to the external electrode via the through electrode. Thus, it is possible to operate the piezoelectric vibrating reed that is sealed in the cavity using the external electrode. Finally, a cutting process of cutting the bonded base substrate wafer and lid substrate wafer to form a plurality of small pieces of piezoelectric vibrators is performed.

As a consequence, it is possible to manufacture a plurality of surface mount type piezoelectric vibrators of a two layer structure, in which the piezoelectric vibrating reed is sealed in the cavity formed between the base substrate and the lid substrate bonded to each other, at a time.

Particularly, since the through hole is formed by the press molding using the forming mold including the lower mold and the upper mold, it is possible to effectively manufacture the through hole in a uniform quality at a time. In addition, since the inner peripheral surface of the through hole can be finished as a flat surface, the conductive paste can stably be filled to enhance the airtightness of the through electrode.

In addition, since the taper angle of the pin of the upper mold is equal to or more than 15°, the taper angle of the through hole is also equal to or more than 15°. Thus, after the base substrate wafer is subjected to the cooling solidification, when detaching the upper mold and the lower mold from each other, it is possible to easily pull out the pin without it being hitched. For that reason, it is possible to prevent the pin from being deformed or bent due to the application of excessive force to the pin. Furthermore, since the pin can be pulled out without being hitched, scratches are not easily generated on the inner peripheral surface of the through hole. Thus, the quality of the through hole can be improved and the airtightness can be further improved on the related art. For that reason, the reliability of the operation of the piezoelectric vibrating reed can be improved.

In addition, since the taper angle of the pin of the upper pin is equal to or less than 20°, the taper angle of the through hole is similarly equal to or less than 20°. Thus, it is possible to actively reduce the difference between the diameter of the opening exposed to the upper surface side of the base substrate wafer and the diameter of the opening exposed to the lower surface side thereof. Thus, the miniaturization of the through electrode itself can be promoted. Accordingly, the size of the piezoelectric vibrator itself can be further miniaturized on the related art.

(2) Furthermore, a piezoelectric vibrator according to the invention includes: a base substrate and a lid substrate which are connected to each other and have a cavity formed therebetween; a piezoelectric vibrating reed that is mounted on the base substrate in the cavity; an external electrode that is formed on a lower surface of the base substrate; a through electrode which is formed so as to pass through the base substrate, maintain the airtightness in the cavity, and electrically connect the piezoelectric vibrating reed and the external electrode, wherein the through electrode is formed by a press molding by a forming mold having a pin, and includes a through hole of a taper-shaped section, in which a taper angle is in the range of 15° or more and 20° or less; and a conductive paste that is hardened after being filled in the through hole.

According to the above-mentioned piezoelectric vibrator, it is possible to obtain the same effect as the method of manufacturing the piezoelectric vibrator described in the above item (1).

(3) Furthermore, an oscillator according to the invention is configured so that the piezoelectric vibrator described in the above item (2) is electrically connected to an integrated circuit as an oscillating element.

(4) Furthermore, electronic equipment according to the invention is configured so that the piezoelectric vibrator described in the above item (2) is electrically connected to a measurement portion.

(5) Furthermore, a radio-controlled timepiece according to the invention is configured so that the piezoelectric vibrator described in the above item (2) is electrically connected to a filter portion.

With the oscillator, the electronic equipment and the radio-controlled timepiece, since they include the miniaturized piezoelectric vibrator in which the reliability of the operation is improved and high quality is promoted, similarly, high quality and miniaturization can be promoted.

With the piezoelectric vibrator according to the invention, since it includes the through electrode in which airtightness is higher than the related art and miniaturization is promoted, the reliability of the operation is improved and high quality can be promoted and miniaturization can be promoted.

Furthermore, with the method of manufacturing the piezoelectric vibrator according to the invention, since a uniform through hole can be formed by the press molding at a time without affecting the pin of the forming mold, the piezoelectric vibrator can be manufactured more effectively than the related art. Thus, it can lead to lower costs.

Moreover, with the oscillator, the electronic equipment and the radio-controlled timepiece according to the invention, similarly, high quality and miniaturization can be promoted.

DETAILED DESCRIPTION OF THE PREFERRED EMBODIMENTS

Figure 1:
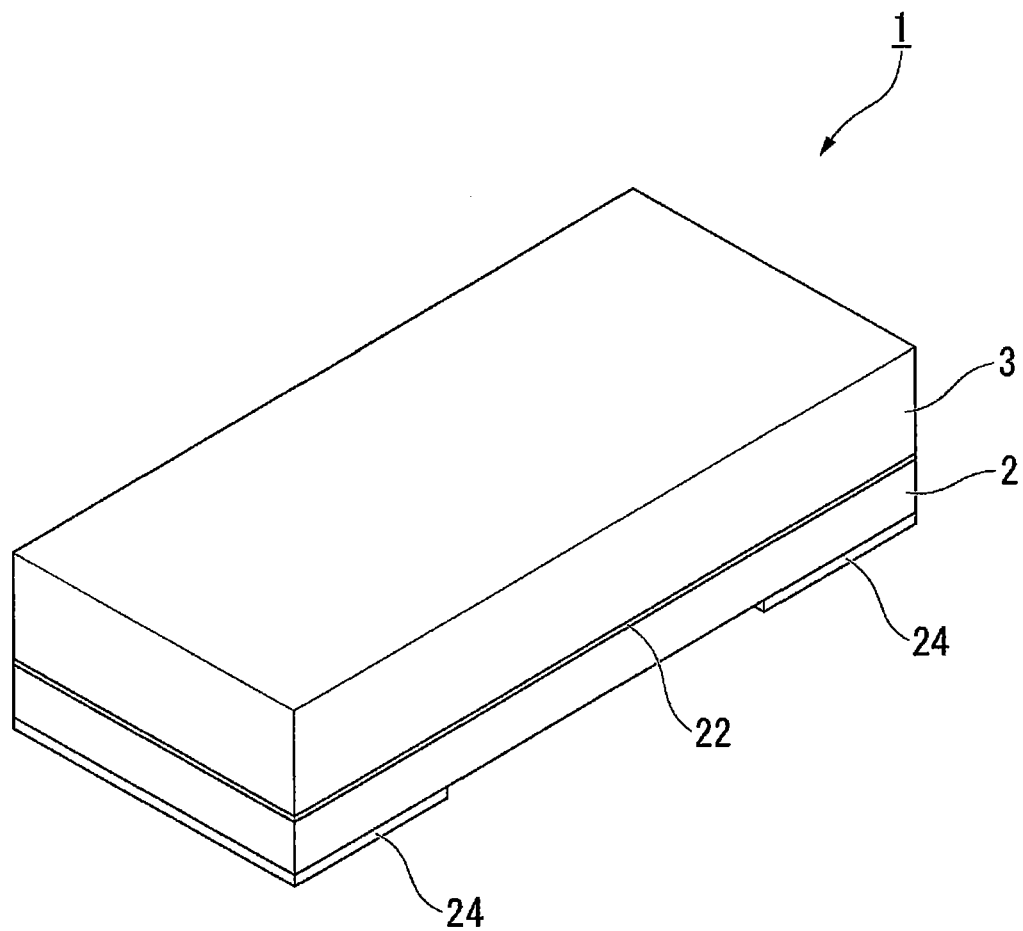
FIG. 1 is an exterior perspective view of a piezoelectric vibrator that shows an embodiment of the invention.

Hereinafter, an embodiment according to the invention will be explained with reference to FIGS. 1 to 21.

As shown in FIGS. 1 to 4, a piezoelectric vibrator 1 of the present embodiment is formed in the shape of a box, in which a base substrate 2 and a lid substrate 3 are stacked in two layers, and is an SMD type piezoelectric vibrator 1 in which a piezoelectric vibrating reed 4 is placed in a cavity C of an inner portion thereof.

Furthermore, in FIG. 4, in order to make it easier to see the drawing, an excitation electrode 13, a lead-out electrode 16, a mount electrode 14 and a metal weight film 17 described later are omitted.

Figure 5:
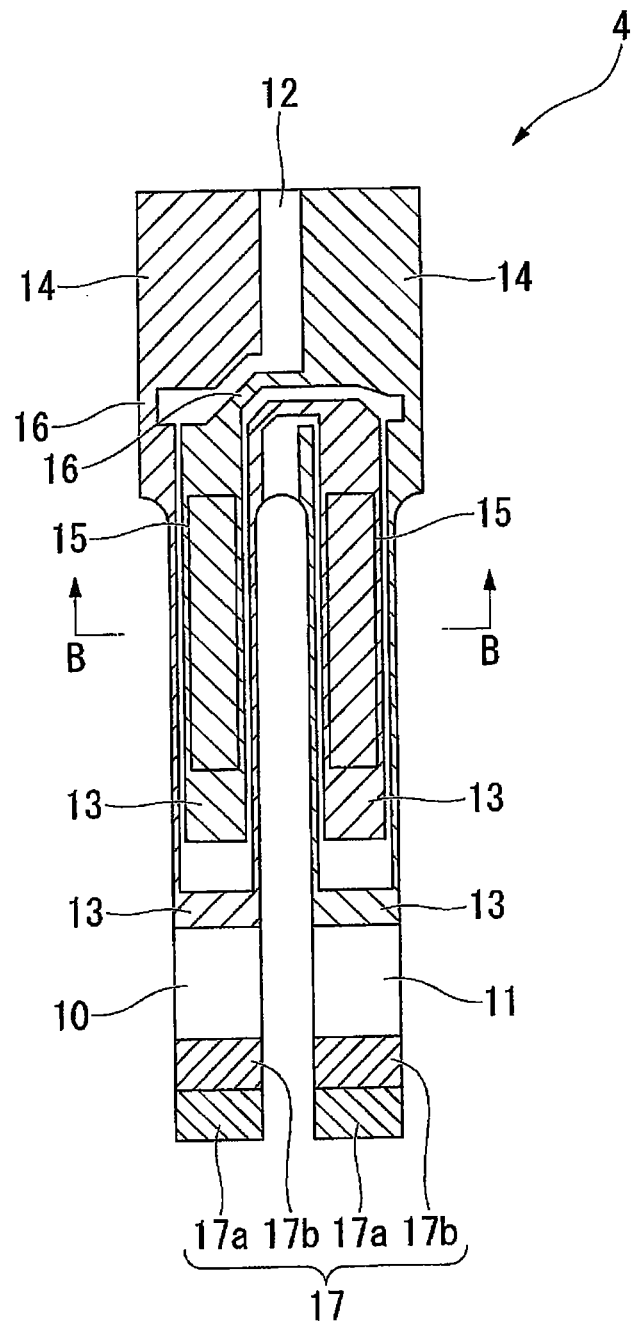
FIG. 5 is a plane view of a piezoelectric vibrating reed constituting the piezoelectric vibrator shown in FIG. 1.
Figure 6:
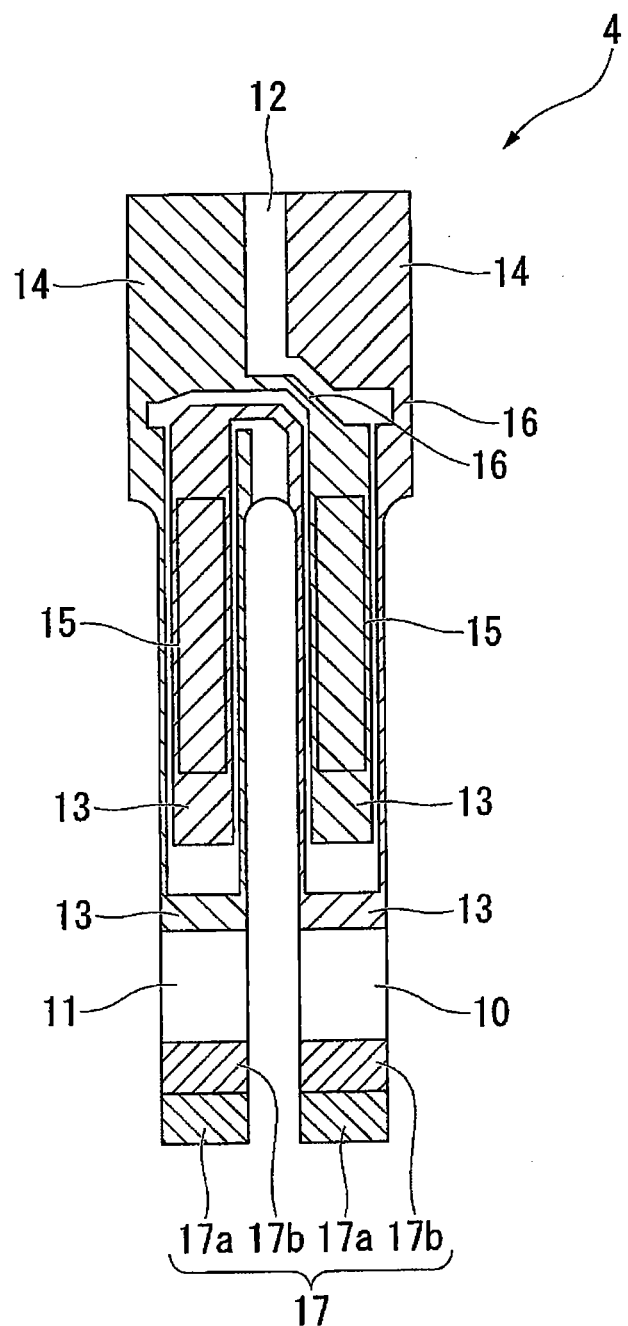
FIG. 6 is a view from below of the piezoelectric vibrating reed shown in FIG. 5.
Figure 7:
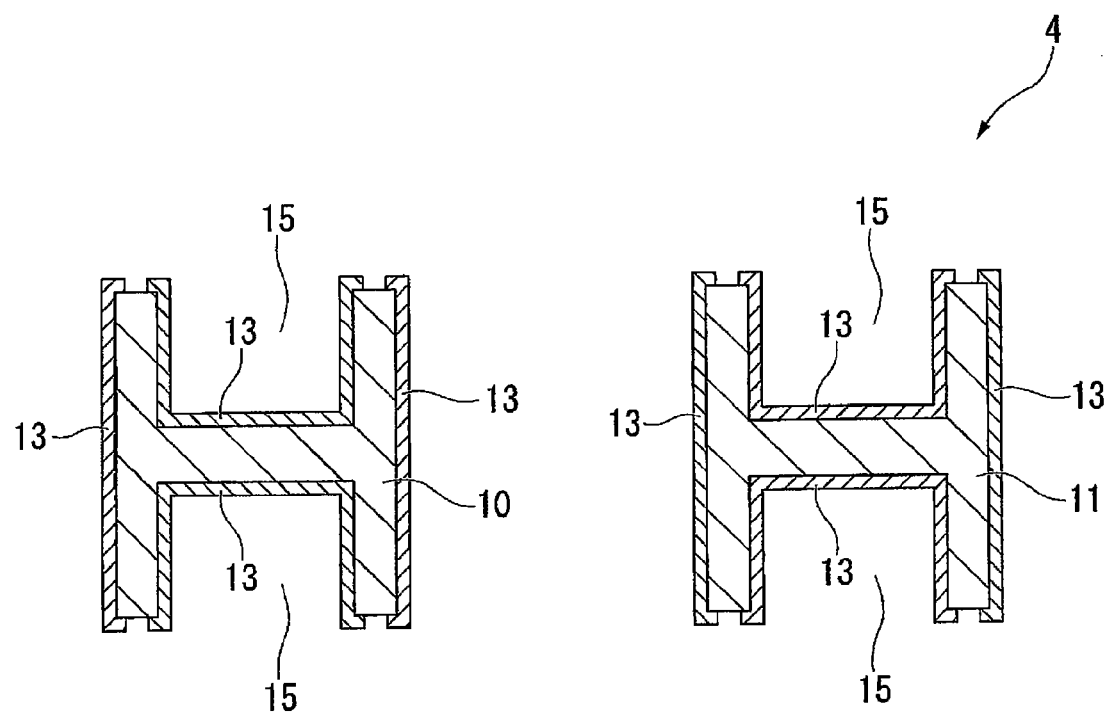
FIG. 7 is a cross-sectional view taken from arrows B-B shown in FIG. 5.
Figure 8:
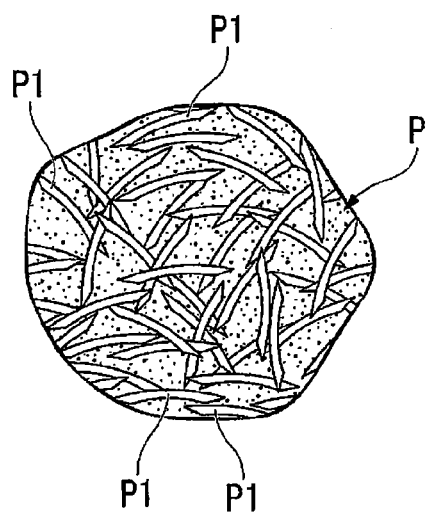
FIG. 8 is an enlarged view of a conductive paste that becomes a source of the through electrode shown in FIG. 3.

As shown in FIGS. 5 to 7, the piezoelectric vibrating reed 4 is a tuning fork type vibrating reed formed of piezoelectric materials such as crystal, lithium tantalate and lithium niobate, and is vibrated when a predetermined voltage is applied.

The piezoelectric vibrating reed 4 has a pair of vibration arm portions 10 and 11 extending in parallel, a base portion 12 that integrally fixes proximal end sides of the pair of vibration arm portions 10 and 11, an excitation electrode 13 that is formed on outer surfaces of the pair of vibration arm portions 10 and 11 to vibrate the pair of vibration arm portions 10 and 11, and a mount electrode 14 that is electrically connected to the excitation electrode 13.

In addition, the piezoelectric vibrating reed 4 of the present embodiment includes a groove portion 15 that is formed on both main surfaces of the pair of vibration arm portions 10 and 11 along the longitudinal direction of the vibration arm portions 10 and 11, respectively. The groove 15 is formed from the proximal end sides of the vibration arm portions 10 and 11 up to approximately near a middle portion.

The excitation electrodes 13 are electrodes that vibrate the pair of vibration arm portions 10 and 11 in a direction approaching and retreating from each other by a predetermined resonant frequency, and are patterned and formed on the outer surfaces of the pair of vibration arm portions 10 and 11 in a state of being electrically separated, respectively. Specifically, as shown in FIG. 7, one excitation electrode 13 is mainly formed on the groove portion 15 of one vibration arm portion 10 and on both side surfaces of the other vibration arm portion 11, and the other excitation electrode 13 is mainly formed on both side surfaces of one vibration arm portion 10 and on the groove portion 15 of the other vibration arm portion 11.

Furthermore, as shown in FIGS. 5 and 6, the excitation electrodes 13 are electrically connected to the mount electrode 14 via a lead-out electrode 16 on both main surfaces of the base portion 12, respectively. Moreover, the voltage is applied to the piezoelectric vibrating reed 4 via the mount electrode 14.

In addition, the excitation electrode 13, the mount electrode 14 and the lead-out electrode 16 are formed, for example, by the coating of conductive films such as chromium (Cr), nickel (Ni), aluminum (Al) and titanium (Ti).

Furthermore, on the front ends of the pair of vibration arm portions 10 and 11, a metal weight film 17 for adjusting (frequency adjustment) so as to vibrate its own vibration state within a range of a predetermined frequency is coated. In addition, the metal weight film 17 is divided into a rough regulation film 17a used when roughly regulating the frequency and a minute regulation film 17b used when minutely regulating the frequency. By performing the frequency regulation using the rough regulation film 17a and the minute regulation film 17b, it is possible to limit the frequencies of the pair of vibration arm portions 10 and 11 within a range of a nominal frequency of a device.

Figure 2:
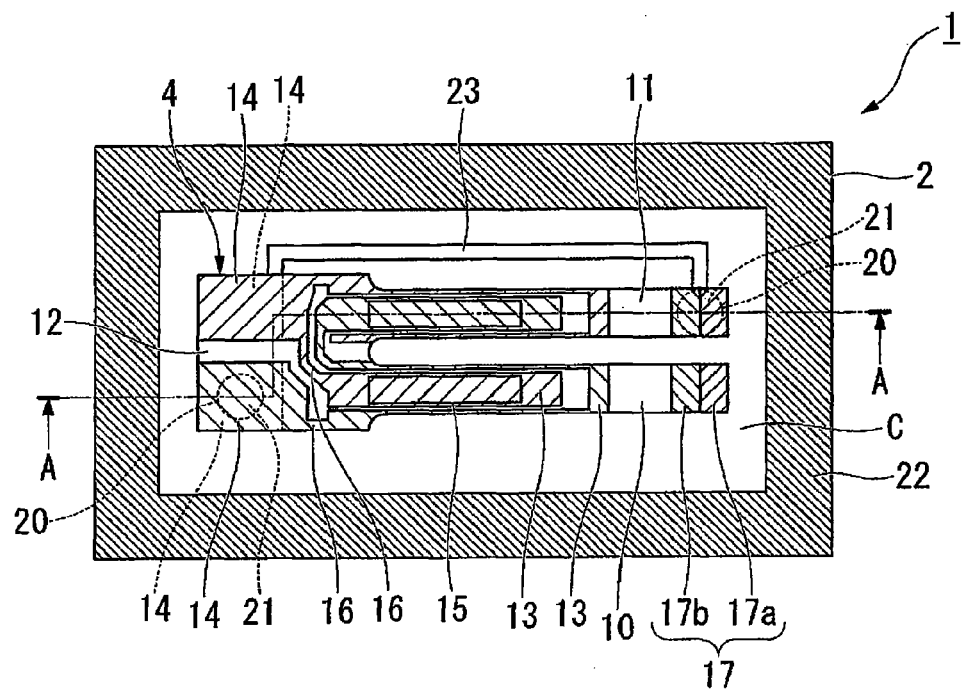
FIG. 2 is a diagram is an inner configuration diagram of the piezoelectric vibrator shown in FIG. 1 which shows a piezoelectric vibrating reed from an upper part with a lid substrate removed therefrom.
Figure 3:
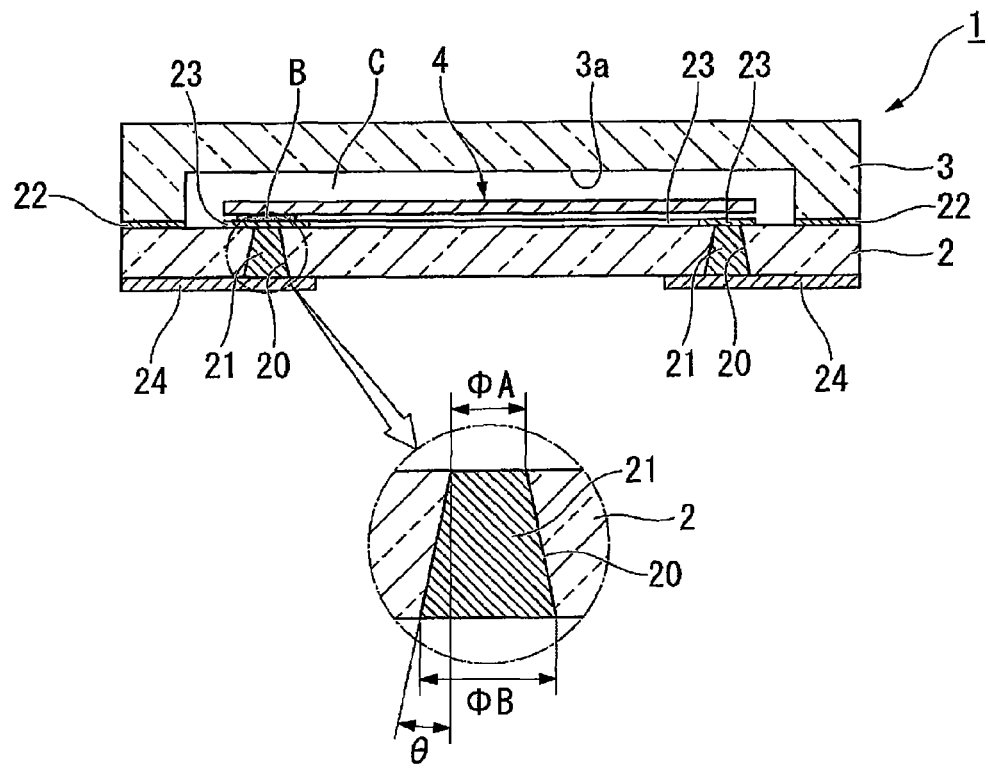
FIG. 3 is a cross-sectional view of the piezoelectric vibrator taken along line A-A shown in FIG. 2.
Figure 4:
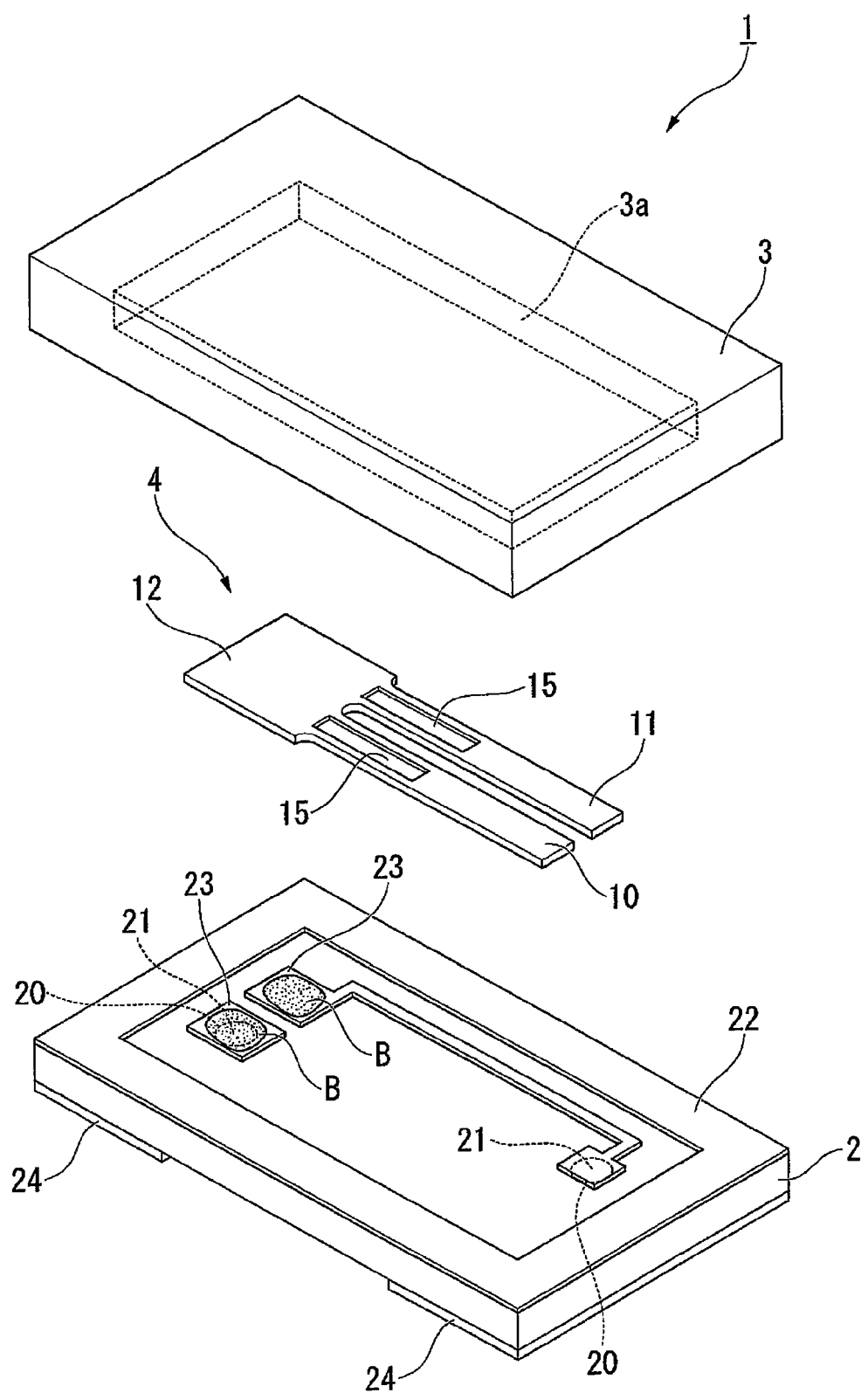
FIG. 4 is an exploded perspective view of the piezoelectric vibrator shown in FIG. 1.

As shown in FIGS. 2 to 4, the piezoelectric vibrating reed 4 configured as above is bump-bonded to the upper surface of the base substrate 2 using a bump B such as gold. More specifically, the pair of mount electrodes 14 is bump-bonded on two bumps B, which are formed on a lead-out electrode 23 described later, respectively, in the contact state. As a result, the piezoelectric vibrating reed 4 is supported in a state floating from the upper surface of the base substrate 2, and the mount electrodes 14 and the lead-out electrode 23 are electrically connected to each other, respectively.

The lid substrate 3 is a transparent insulation substrate formed of a glass material, for example, soda lime glass, and, as shown in FIGS. 1, 3, and 4, is formed in the plate shape. Furthermore, on a lower surface side (a bonding surface side to which the base substrate 2 is bonded) of the lid substrate 3, a rectangular concave portion 3a, into which the piezoelectric vibrating reed 4 enters, is formed. The concave portion 3a is a concave portion for the cavity becoming the cavity C which accommodates the piezoelectric vibrating reed 4 when both of the substrates 2 and 3 are overlapped with each other. Moreover, the lid substrate 3 is anode-bonded to the base substrate 2 in a state in which the concave portion 3a is opposed to the base substrate 2 side.

The base substrate 2 is a transparent insulation substrate formed of the same glass material as the lid substrate 3, for example, soda lime glass, and, as shown in FIGS. 1 to 4, is formed in the shape of a plate and large enough to be able to overlap with the lid substrate 3.

On the base substrate 2, a pair of through holes 20 penetrating the base substrate 2 is formed. At this time, the pair of through holes 20 is formed so as to be put into the cavity C. To explain in more detail, it is formed so that one through hole 20 is situated at the base portion 12 side of the mounted piezoelectric vibrating reed 4 and the other through hole 20 is situated at the front end sides of the vibration arm portion 11.

The through hole 20 of the present embodiment is formed by the press molding by the forming mold 30 having a pin 33 described later, and, as shown in FIG. 3, is formed to have a taper-shaped section in which the diameter thereof is gradually expanded toward the lower surface of the base substrate 2. At this time, the taper angle θ is in the range of 15° or more and 20° or less.

In the pair of through holes 20, a pair of through electrodes 21 formed so as to bury the through holes 20 are formed. The through electrode 21 are formed by the hardening of a conductive paste P shown in FIG. 8 including a plurality of metal particles P1, completely block the through holes 20 to maintain the airtightness of the cavity C, and electrically connect an external electrode 24 described later with the lead-out electrode 23.

In addition, a plurality of metal particles P1 are brought into contact with each other and are joined to each other, whereby the electric conductivity of the conductive paste P is secured.

On the upper surface side (a bonding surface side to which the lid substrate 3 is bonded) of the base substrate 2, as shown in FIGS. 1 to 4, a bonding film 22 for the anode-bonding and a pair of lead-out electrodes 23 are patterned by a conductive material (for example, aluminum). Among them, the bonding film 22 is formed along the periphery of the base substrate 22 so as to surround the periphery of the concave portion 3a formed on the lid substrate 3.

The pair of lead-out electrodes 23 is patterned so as to electrically connect the pair of through electrodes 21 with the pair of mount electrodes 14 of the piezoelectric vibrating reed 4, respectively. To explain in more detail, as shown in FIGS. 2 and 4, one lead-out electrode 23 is formed immediately over the one through electrode 21 so as to be situated immediately under the base portion 12 of the piezoelectric vibrating reed 4. In addition, the other lead-out electrode 23 is formed so as to be lead-out from a position adjacent to one lead-out electrode 23 to the front end side of the vibration arm portion 11 along the vibration arm portion 11, and then be situated immediately over the other through electrode 21.

Moreover, a bump B is formed on the pair of lead-out electrodes 23 and the piezoelectric vibrating reed 4 is mounted using the bump B. As a result, the piezoelectric vibrating reed 4 is electrically connected to the through electrode 21 via the bump B and the lead-out electrode 23.

Moreover, as shown in FIGS. 1, 3 and 4, on the lower surface of the base substrate 2, external electrodes 24, which are electrically connected to through electrodes 21, respectively, are formed. As a result, the piezoelectric vibrating reed 4 is electrically connected to the external electrode 24 via the through electrode 21.

In the case of operating the piezoelectric vibrator 1 configured as above, a predetermined driving voltage is applied to the external electrodes 24 formed on the base substrate 2. As a result, it is possible to make the electric current flow to the excitation electrode 13 of the piezoelectric vibrating reed 4, which makes it possible to vibrate the pair of vibration arm portions 10 and 11 in the approaching and separating direction by a predetermined frequency. Moreover, it is possible to use the vibration of the pair of vibration arm portions 10 and 11 as a time source, a timing source of the control signal, a reference signal source or the like.

Next, a method of manufacturing a plurality of piezoelectric vibrators 11 using a base substrate wafer 40 and a lid substrate wafer 50 at a time will be explained with reference to the flow chart shown in FIG. 9.

Firstly, a piezoelectric vibrating reed production process is performed to produce the piezoelectric vibrating reed 4 shown in FIGS. 5 to 7 (S10). Specifically, firstly, a crystal Lambert gemstone is sliced at a predetermined angle to make a wafer of a fixed thickness. Next, after the wafer is wrapped and is subjected to rough working, a deformed layer is removed by the etching, and then a mirror surface polishing such as a polish is performed, thereby making a wafer of a predetermined thickness. Next, after the wafer is subjected to a suitable processing such as cleaning, it is patterned by a photolithograph technique or the like to the exterior shapes of the piezoelectric vibrating reed 4, and the film formation and the patterning of the metallic film are performed, thereby forming the excitation electrode 13, the lead-out electrode 16, the mount electrode 14 and the metal weight film 17. As a result, a plurality of piezoelectric vibrating reeds 4 can be produced.

After producing the piezoelectric vibrating reed 4, the rough regulation of the resonance frequency is performed. This is performed by irradiating the rough regulation film 17a of the metal weight film 17 with a laser beam to evaporate a part thereof and to change the weight thereof. As a result, the frequency can be limited within a range slightly wider than the nominal frequency of the object. In addition, a minute regulation, in which the resonance frequency is further accurately regulated to put in the range of the final nominal frequency, is performed after the mount. This will be described later.

Figure 10:
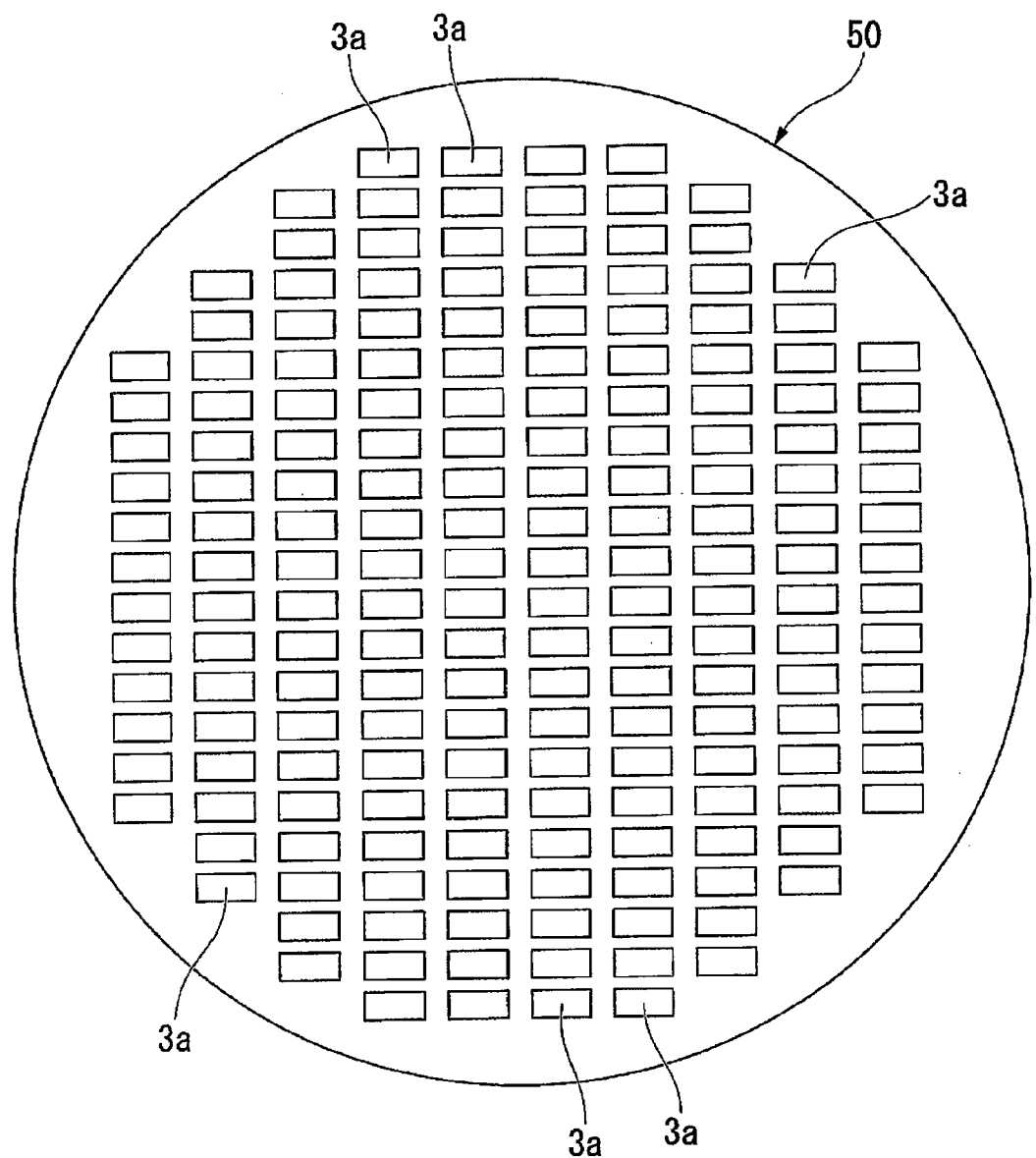
FIG. 10 is a diagram showing a process when manufacturing the piezoelectric vibrator along a flow chart shown in FIG. 9 which shows a state in which a concave portion is formed in a lid substrate wafer that becomes a source of the lid substrate.

Next, a first wafer producing process, in which the lid substrate wafer 50 becoming the lid substrate 3 later is produced up to a state immediately before performing anode-bonding, is performed (S20). Firstly, after the soda lime glass is polished up to a predetermined thickness and is cleaned, as shown in FIG. 10, a circular plate shaped lid substrate wafer 50, in which the deformed layer of the uppermost surface most is removed by etching or the like, is formed (S21). Next, a concave portion 3a forming process, in which a plurality of concave portions 3a for the cavity C on the bonding surface of the lid substrate wafer 50 in a column and row direction, is performed (S22).

At this time, the concave portion 3a may be formed by etching the lid substrate wafer 50. Furthermore, by pressing the lid substrate wafer 50 from above and below using a jig while heating the lid substrate wafer 50, the concave portion 3a may be formed. In addition, by screen-printing a glass paste in the necessary place on the lid substrate wafer 50, the concave portion 3a may be formed. Any method may be used. At this point of time, the first wafer producing process is finished.

Next, at the timing simultaneously with or immediately before and after the process, a second wafer producing process, in which the base substrate wafer 40 that later becomes the base substrate 2 is produced until the state immediately before performing anode-bonding, is performed (S30). Firstly, after the soda lime glass is polished up to a predetermined thickness and is cleaned, a circular plate-shaped base substrate wafer 40, in which a deformed layer of the uppermost surface is removed by etching or the like, is formed (S31). Next, a through electrode forming process, in which a plurality of pairs of through electrode 21 penetrating the base substrate wafer 40, is performed (S32).

The through electrode forming process includes a setting process (S32a), a pressing process (S32b) and a baking process (S32c). The respective processes will be described in detail.

Figure 11:
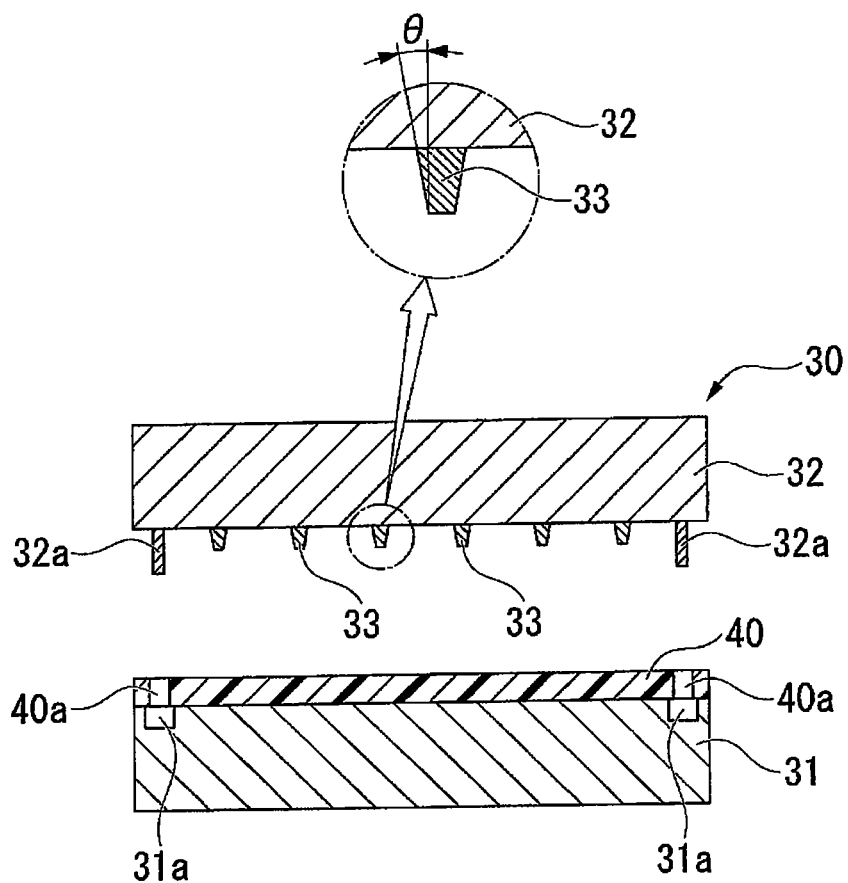
FIG. 11 is a diagram showing a process when manufacturing the piezoelectric vibrator along a flow chart shown in FIG. 9 which shows a state in which a base substrate wafer that becomes a source of the base substrate is set between the lower mold and the upper mold.

Firstly, as shown in FIG. 11, a forming mold 30, which includes a lower mold 31 and an upper mold 32 having a pin 33 protruding toward the lower mold 31, is prepared. At this time, a pin 33 of the upper mold 32, which has a taper-shaped section in which the diameter thereof is gradually shortened toward the front end thereof and the taper angle θ is within the range of 15° or more and 20° or less, is prepared. Furthermore, separately from the pin 33, a positioning pin 32a which enters a positioning hole 31a provided in the lower mold 31 is attached to the upper mold 32.

After the forming mold 30, the base substrate wafer 40 is set between the lower mold 31 and the upper mold 32. At this time, an insertion hole 40a, into which the positioning pin 32a is inserted, is opened to the base substrate wafer 40, and the insertion hole 40a is set so as to face the positioning hole 31a.

Figure 12:
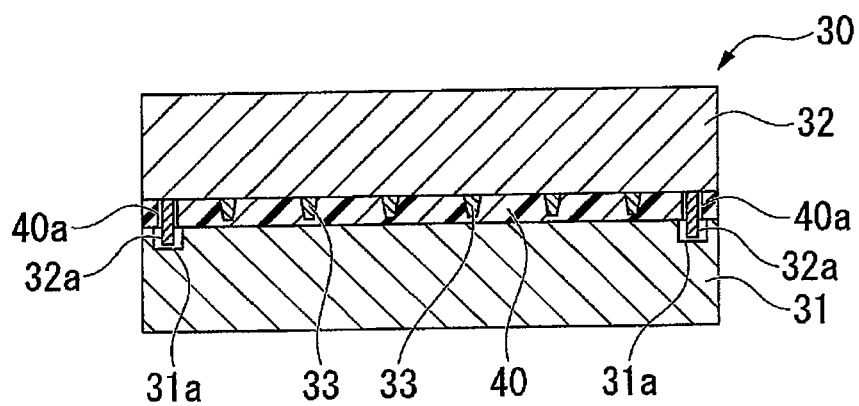
FIG. 12 is a diagram showing a state in which the base substrate wafer is pressed by the lower mold and the upper mold after the state shown in FIG. 11.

After the setting process (S32a) is finished, the whole base substrate wafer 40 is put into a furnace, the base substrate wafer 40 is heated to a predetermined temperature (a temperature more than a glass softening point) and is softened, and the base substrate wafer 40 is subjected to the press molding by the lower mold 31 and the upper mold 32. As a result, as shown in FIG. 12, it is possible to form the through hole 20 with a taper-shaped section in the base substrate wafer 40 using the pin 33 of the upper mold 32. In addition, when performing the process, the positioning pin 33 of the upper mold 32 is inserted into the insertion hole 40a of the base substrate wafer 40 and enters the positioning hole 31a of the lower mold 31. Thus, since the lower mold 31, the upper mold 32 and the base substrate wafer 40 are reliably positioned, respectively, the through hole 20 can be accurately formed in a desired position.

Figure 13:
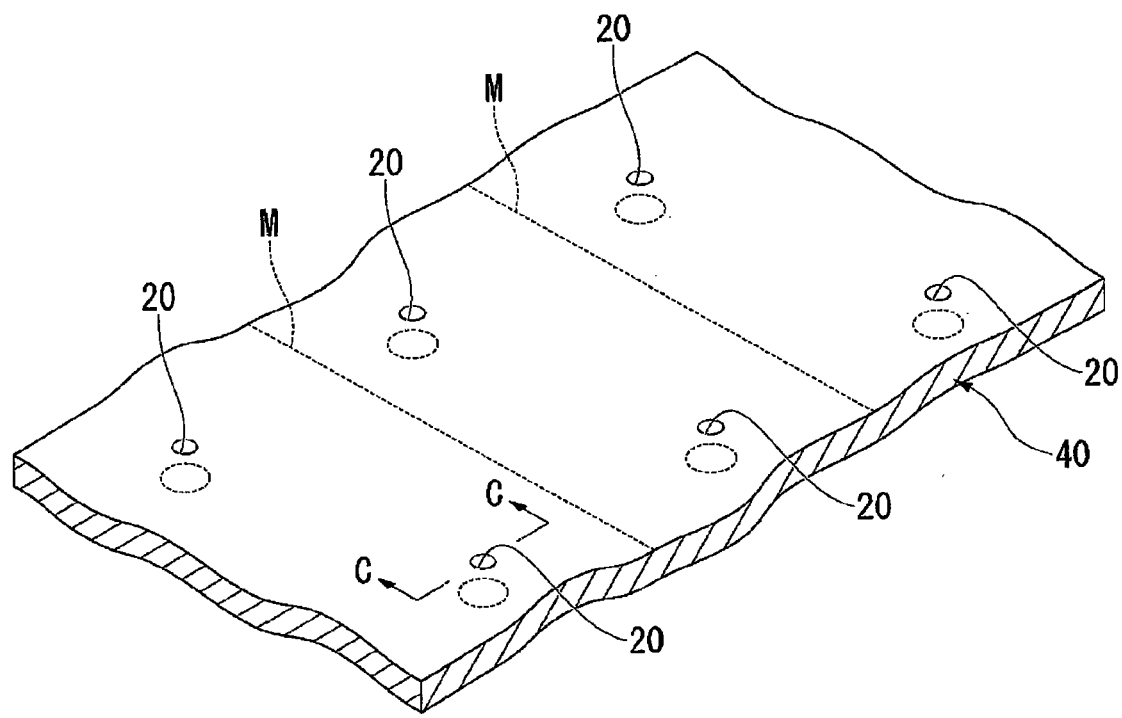
FIG. 13 is a diagram showing a state in which a pair of through holes is formed in the base substrate wafer after the state shown in FIG. 12.
Figure 14:
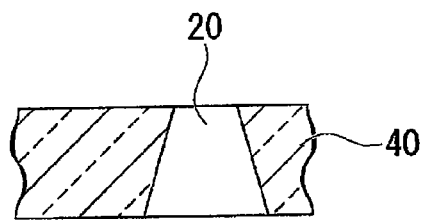
FIG. 14 is a cross-sectional view take along line C-C shown in FIG. 13.

Furthermore, after the pressing process (S32b) is finished, the base substrate wafer 40 is subjected to cooling solidification and then the lower mold 31 and the upper mold 32 are detached from each other. As a result, as shown in FIGS. 13 and 14, a plurality of through holes 20 can be formed in the base substrate wafer 40. In addition, the dashed lines M shown in FIG. 13 show cutting lines to be cut in a cutting process performed later. Furthermore, in the case of forming the through hole 20, when both wafers 40 and 50 are overlapped with each other later, the through hole 20 is formed so as to enter the concave portion 3a formed in the lid substrate wafer 50. In addition, one through hole 20 is situated in the base portion 12 side of the piezoelectric vibrating reed 4 and the other through hole 20 is situated in the front end side of the vibration arm portion 11.

Figure 15:
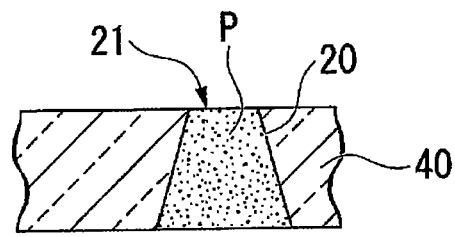
FIG. 15 is a diagram showing a state in which a conductive paste is filled in a through hole after the state shown in FIG. 14 and then is baked to form a through electrode.

Next, as shown in FIG. 15, the conductive paste P including the metal particle P1 is filled into the formed through hole 20 without gaps to block the through hole 20. Next, the baking process of baking the buried paste to a predetermined temperature and hardening the same is performed. By performing the baking process, since the conductive paste P is strongly fixed to the inner peripheral surface of the through hole 20, the through electrode 21 of the taper-shaped section can be formed. At this point in time, the through electrode forming process is finished.

Figure 16:
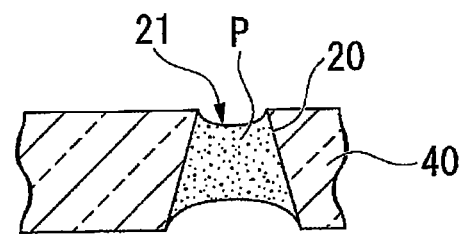
FIG. 16 is a diagram showing a state in which the volume of the conductive paste is reduced by the baking.

In addition, since an organic matter in the conductive paste P (not shown) is evaporated at the time of baking, the volume of the hardened conductive paste P is reduced compared to the filling time as shown in FIG. 16. For that reason, the concave portion is necessarily formed on the surface of the conductive paste P.

Figure 17:
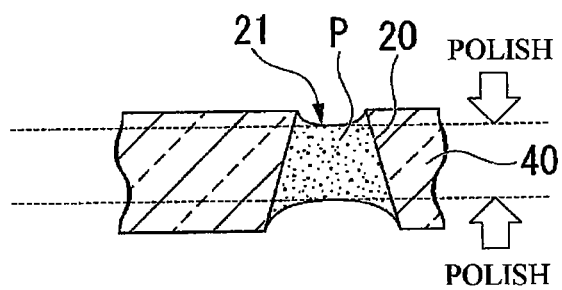
FIG. 17 is a diagram showing a state in which both surfaces of the base substrate wafer are polished by the reduced conductive paste.

However, in the present embodiment, after the baking, as shown in FIG. 17, the polishing process (S33) of polishing both surfaces of the base substrate wafer 40 by a predetermined thickness, respectively, is performed. By performing the process, since both surfaces of the conductive paste P hardened by the baking are also concurrently polished, the periphery of the concave portion can be chip off. That is, the surface of the conductive paste P can be flattened.

Figure 18:
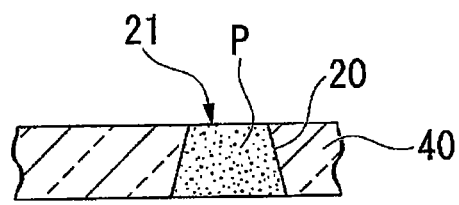
FIG. 18 is a diagram showing a state after the polishing.

Accordingly, as shown in FIG. 18, it is possible to make the surface of the base substrate wafer 40 substantially the same surface as the surface of the through electrode 21.

Figure 19:
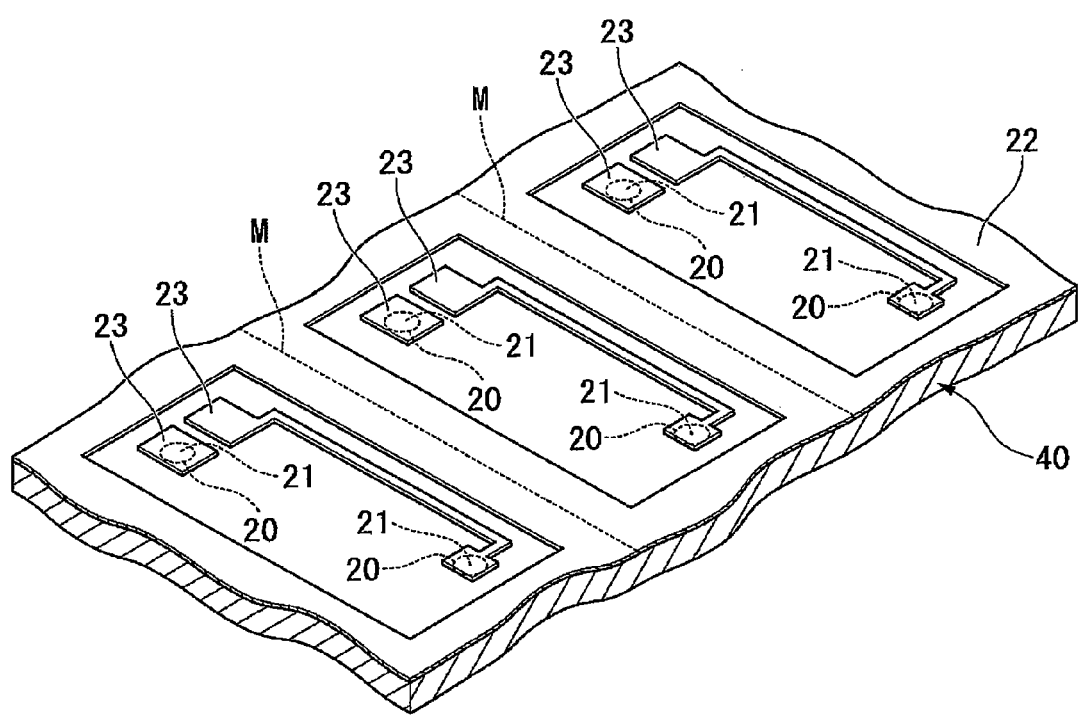
FIG. 19 is a diagram showing a state in which a bonding film and a lead-out electrode are patterned on an upper surface of the base substrate wafer after the state shown in FIG. 18.
Figure 20:
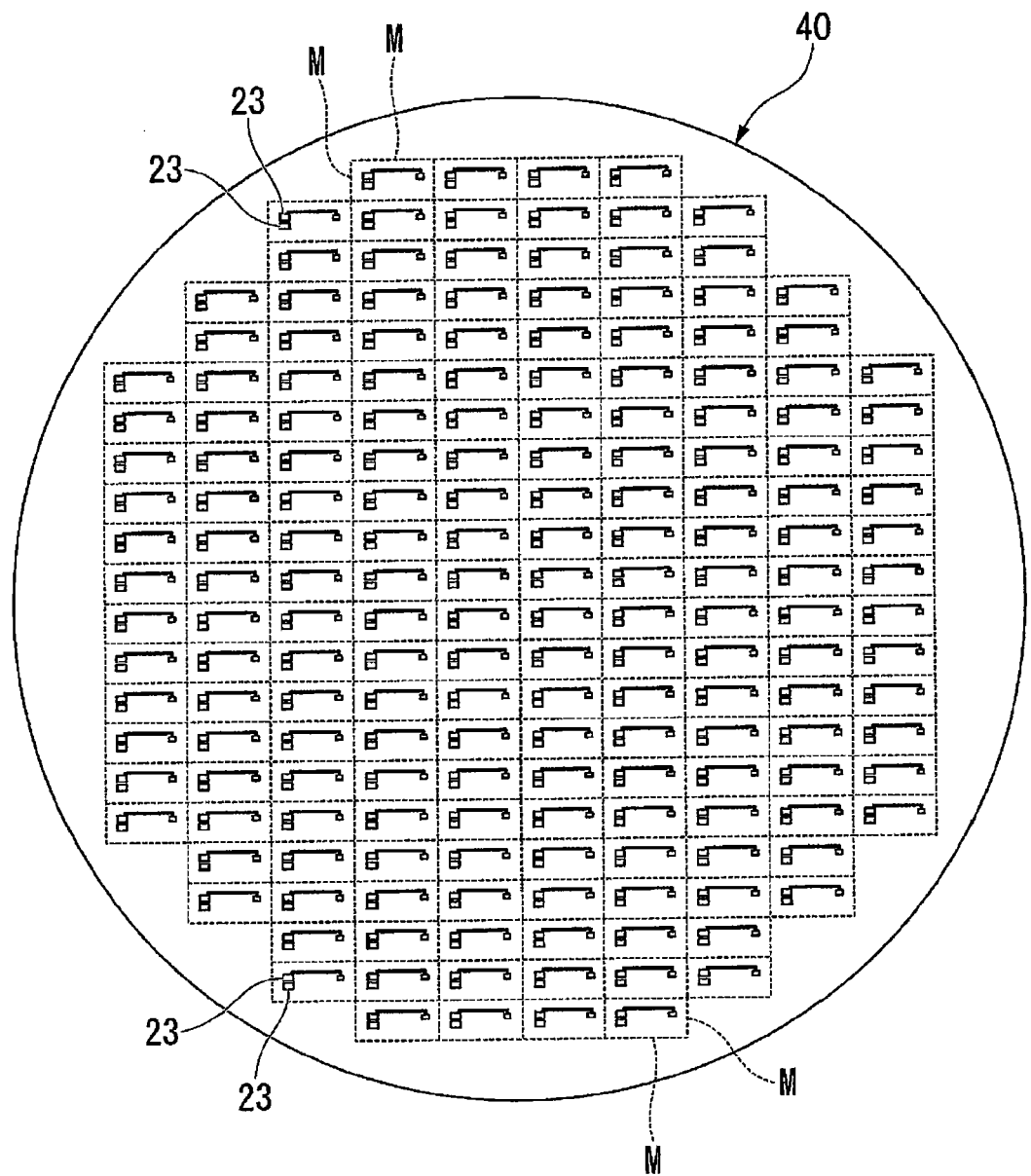
FIG. 20 is an overall diagram of the base substrate wafer of the state shown in FIG. 19.

Next, a bonding film forming process, in which the conductive material is patterned on the upper surface of the base substrate wafer 40 to form the bonding film 22, as shown in FIGS. 19 and 20 is performed (S34), and a lead-out electrode forming process, in which a plurality of lead-out electrodes 23 electrically connected to the pairs of through electrodes 21, respectively is formed, is performed (S35). In addition, the dashed lines M shown in FIGS. 19 and 20 show the cutting lines which are cut in a cutting process performed later. Furthermore, in FIG. 20, the bonding film 22 is omitted.

By performing the process, one through electrode 21 is electrically connected to one lead-out electrode 23, and the other through electrode 21 is electrically conducted to the other lead-out electrode 23. At this point in time, the second wafer producing process is finished.

Figure 9:
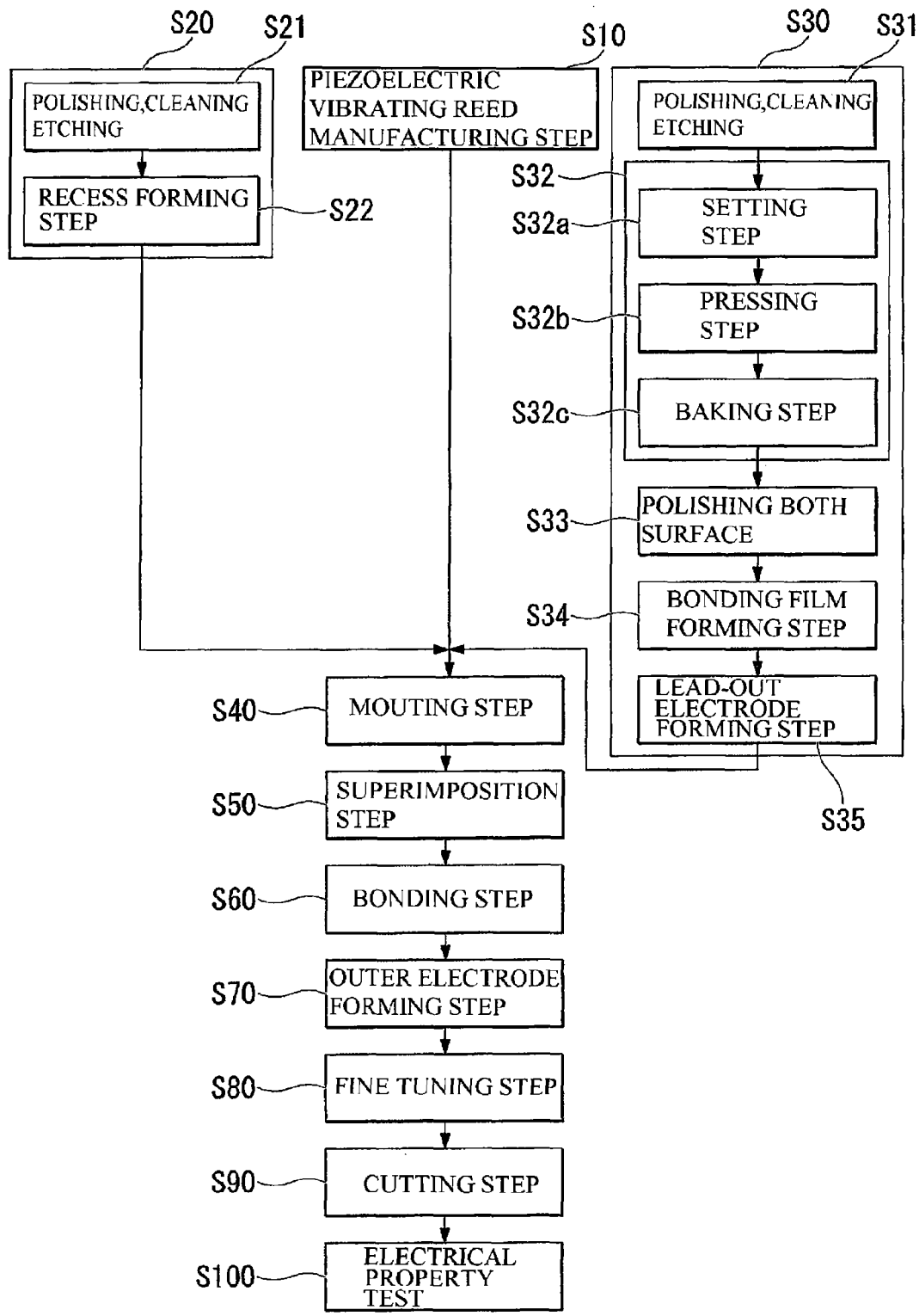
FIG. 9 is a flow chart that shows the flow when manufacturing the piezoelectric vibrator shown in FIG. 1.

However, in FIG. 9, after the bonding film forming process (S34), the lead-out electrode forming process (S35) is sequentially performed, but, on the other hand, after the lead-out electrode forming process (S35), the bonding film forming process (S34) may be performed, or both processes may be concurrently performed. Even in any process order, the same effect can be obtained. Thus, the process order may be suitably changed as occasion demands.

Next, a mounting process (S40), in which a plurality of produced piezoelectric vibrating reeds 4 is bonded to the upper surface of the base substrate wafer 40 so as to be electrically connected to the through electrode 21, is performed. Specifically, the piezoelectric vibrating reed 4 is bump-bonded to the upper surface of the base substrate wafer 40 via the lead-out electrode 23. Firstly, the bump B such as gold is formed on the lead-out electrodes 23, respectively. Moreover, after the base portion 12 of the piezoelectric vibrating reed 4 is mounted on the bump B, the piezoelectric vibrating reed 4 is pressed to the bump B while heating the bump B at a predetermined temperature. As a result, the piezoelectric vibrating reed 4 is mechanically supported on the bump B, and the mount electrodes 14 and the lead-out electrodes 23 are electrically connected to each other. Thus, the piezoelectric vibrating reed 4 is electrically connected to the through electrodes 21.

Particularly, since the piezoelectric vibrating reed 4 is bump-bonded, it is supported in the state of floating from the upper surface of base substrate wafer 40.

After mounting of the piezoelectric vibrating reed 4 is finished, an overlapping process, in which the lid substrate wafer 50 is overlapped with the base substrate wafer 40, is performed (S50). Specifically, both wafers 40 and 50 are aligned in the correct position while setting a standard mark (not shown) as an index. As a result, the mounted piezoelectric vibrating reed 4 is accommodated within the cavity C which is surrounded by the concave portion 3a formed on the base substrate wafer 40 and both wafers 40 and 50.

Moreover, a bonding process, in which two overlapped wafers 40 and 50 are put into an anode-bonding device (not shown) and a predetermined voltage is applied in a predetermined temperature environment to perform the anode-bonding, is performed (S60). Specifically, a predetermined voltage is applied between the bonding film 22 and the lid substrate wafer 50. Then, an electrochemical reaction occurs in an interface between the bonding film 22 and the lid substrate wafer 50, whereby both are strongly brought into close contact with each other and are anode-bonded. As a result, the piezoelectric vibrating reed 4 can be sealed in the cavity 4, which makes it possible to obtain the wafer body 60 shown in FIG. 21 in which the base substrate wafer 40 and the lid substrate wafer 50 are bonded to each other.

Figure 21:
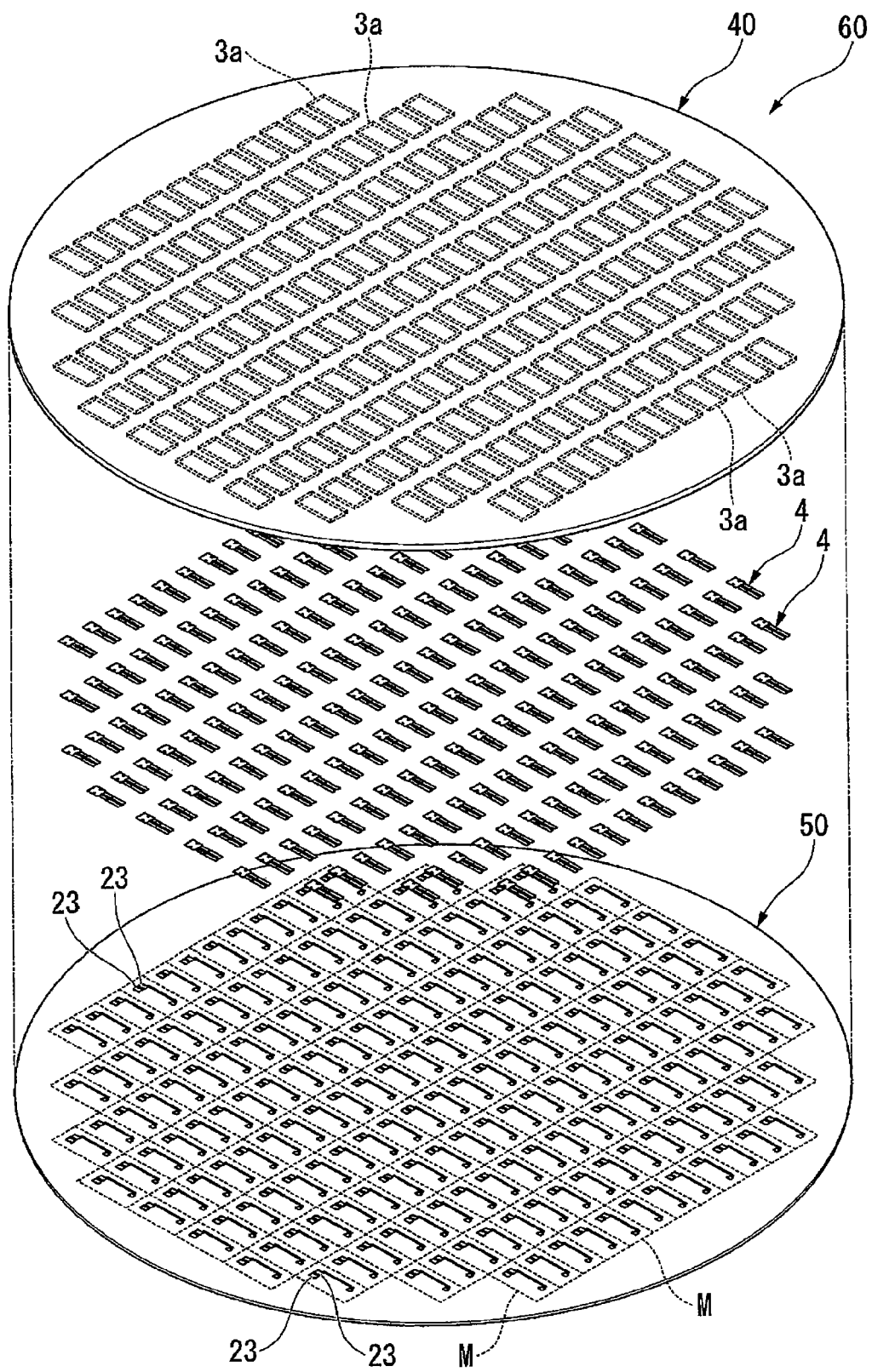
FIG. 21 is a diagram showing a process when manufacturing the piezoelectric vibrator along a flow chart shown in FIG. 9 which shows an exploded perspective view of a wafer body in which the base substrate wafer and the lid substrate wafer are subjected to anode-bonding in a state in which the piezoelectric vibrating reed is accommodated in the cavity.
Figure 22:
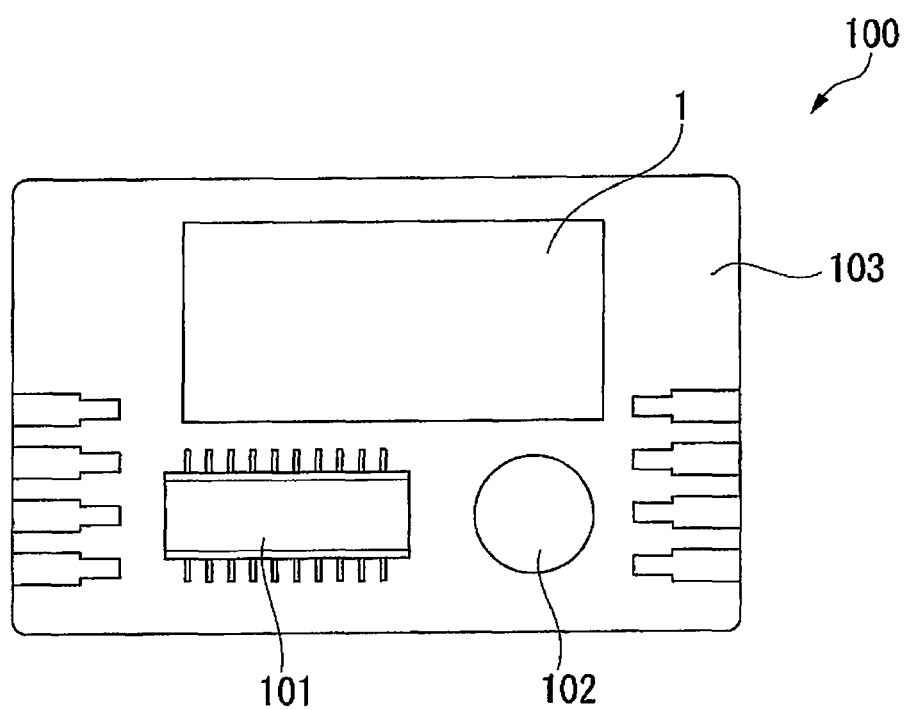
FIG. 22 is a configuration diagram of an oscillator showing an embodiment of the invention.

In addition, in FIG. 21, in order to make the drawing easier to see, a state in which the wafer body 60 is disassembled is shown, and the bonding film 22 from the base substrate wafer 40 is omitted. In addition, the dashed lines M shown in FIG. 21 show the cutting lines to be cut in a cutting process performed later.

However, when performing the anode-bonding, since the through hole 20 formed in the base substrate wafer 40 is completely blocked by the through electrode 21, the airtightness in the cavity C is not lost through the through hole 20.

Moreover, after the anode-bonding process is finished, an external electrode forming process, in which a conductive material is patterned on the lower surface of the base substrate wafer 40, and a plurality of pairs of external electrodes 24 electrically connected to the pair of through electrodes 21, respectively is formed, is performed (S70). By this process, the piezoelectric vibrating reed 4 is electrically connected to the external electrode 24 via the through electrode 21. Thus, it is possible to operate the piezoelectric vibrating reed 4 sealed in the cavity C using the external electrodes 24.

Next, a minute regulation process, in which in the state of the wafer body 60, the frequency of the respective piezoelectric vibrators 1 sealed in the cavity C is minutely adjusted to put the same into a predetermined range, is performed (S80). To explain specifically, the voltage is applied to the pair of external electrodes 24 to vibrate the voltage vibrating reed 4. Moreover, a laser beam is irradiated from the outside through the lid substrate wafer 50 while measuring the frequency, thereby evaporating the minute regulation film 17b of the metal weight film 17. As a result, the weight of the front end sides of the pair of vibration arm portions 10 and 11 is changed, which makes it possible to minutely regulate the frequency of the piezoelectric vibrating reed 4 so as to be put into a predetermined range of the nominal frequency.

After the minute regulation of the frequency is finished, a cutting process, in which the bonded wafer body 60 is cut along the cutting lines M shown in FIG. 21 to form small pieces, is performed (S90). As a result, it is possible to manufacture a plurality of SMD type piezoelectric vibrators 1, in which the piezoelectric vibrating reed 4 is sealed in the cavity C formed between the base substrate 2 and the lid substrate 3 that are anode-bonded to each other, shown in FIG. 1 at a time.

In addition, after the cutting process (S90) is performed to form the small pieces to the respective piezoelectric vibrators 1, the minute regulation process (S80) may be performed. However, as described above, by performing the minute regulation process (S80) in advance, the minute regulation can be performed in the state of the wafer body 60, which makes it possible to more effectively and minutely regulate the plurality of piezoelectric vibrators 1. Accordingly, it is desirable in that an improvement in throughput can be promoted.

After that, an internal electrical property inspection is performed (S100). That is, the resonant frequency, the resonant resistance value, the drive level property (an excitation electric power dependence of the resonant frequency and the resonant resistance value) or the like of the piezoelectric vibrating reed 4 are measured and checked. Furthermore, the insulation resistance property or the like is jointly checked. Moreover, the exterior inspection of the piezoelectric vibrator 1 is performed at the end, and the size, the quality or the like are finally checked. As a result, the manufacturing of the piezoelectric vibrator 1 is finished.

Particularly, according to the present embodiment, since the through hole 20 is formed by the press molding by the forming mold 30 including the lower mold 31 and the upper mold 32, the through hole 20 can be effectively formed in a uniform quality at a time. In addition, since the inner peripheral surface of the through hole 20 can be finished as a flat surface, the conductive paste P can stably be filled to enhance the airtightness of the through electrode 21.

In addition, since the taper angle θ of the pin 33 of the upper mold 32 is equal to or more than 15°, the taper angle θ of the through hole 20 is also equal to and more than 15°. Thus, after the base substrate wafer 40 is subjected to the cooling solidification, when detaching the upper mold 31 and the lower mold 32 from each other, it is possible to easily pull out the pin 33 without it being hitched. For that reason, it is possible to prevent the pin form being deformed or bent due to the application of excessive force to the pin 33. Furthermore, since the pin 33 can be pulled out without being hitched, the scratch is not easily generated on the inner peripheral surface of the through hole 20. Thus, the quality of the through hole 20 can be improved and the airtightness can be further improved on the related art. For that reason, the reliability of the operation of the piezoelectric vibrating reed 4 can be improved.

In addition, since the taper angle θ of the pin 33 of the upper pin 32 is equal to or less than 20°, the taper angle θ of the through hole 20 is similarly equal to or less than 20°. Thus, as shown in FIG. 3, it is possible to actively reduce the difference between a diameter φA of the opening exposed to the upper surface side of the base substrate wafer 40 and a diameter φB of the opening exposed to the lower surface side thereof. Thus, the miniaturization of the through electrode 21 itself can be promoted. Accordingly, the size of the piezoelectric vibrator 1 itself can be further miniaturized on the related art.

As mentioned above, according to the piezoelectric vibrator 1 of the present embodiment, since it has the through electrode 21 in which the airtightness is higher than the related art and miniaturization is promoted, the reliability of the operation is improved, high quality can be promoted, and the miniaturization can be promoted.

Furthermore, according to the method of manufacturing the piezoelectric vibrator 1, since the through hole 20 can be formed by the press molding with uniform quality at a time without affecting the pin 33 of the forming mold 30, the piezoelectric vibrator 1 can be manufactured more effectively than the related art.

Next, an embodiment of the oscillator according to the invention will be explained with reference to FIG. 23.

Figure 23:
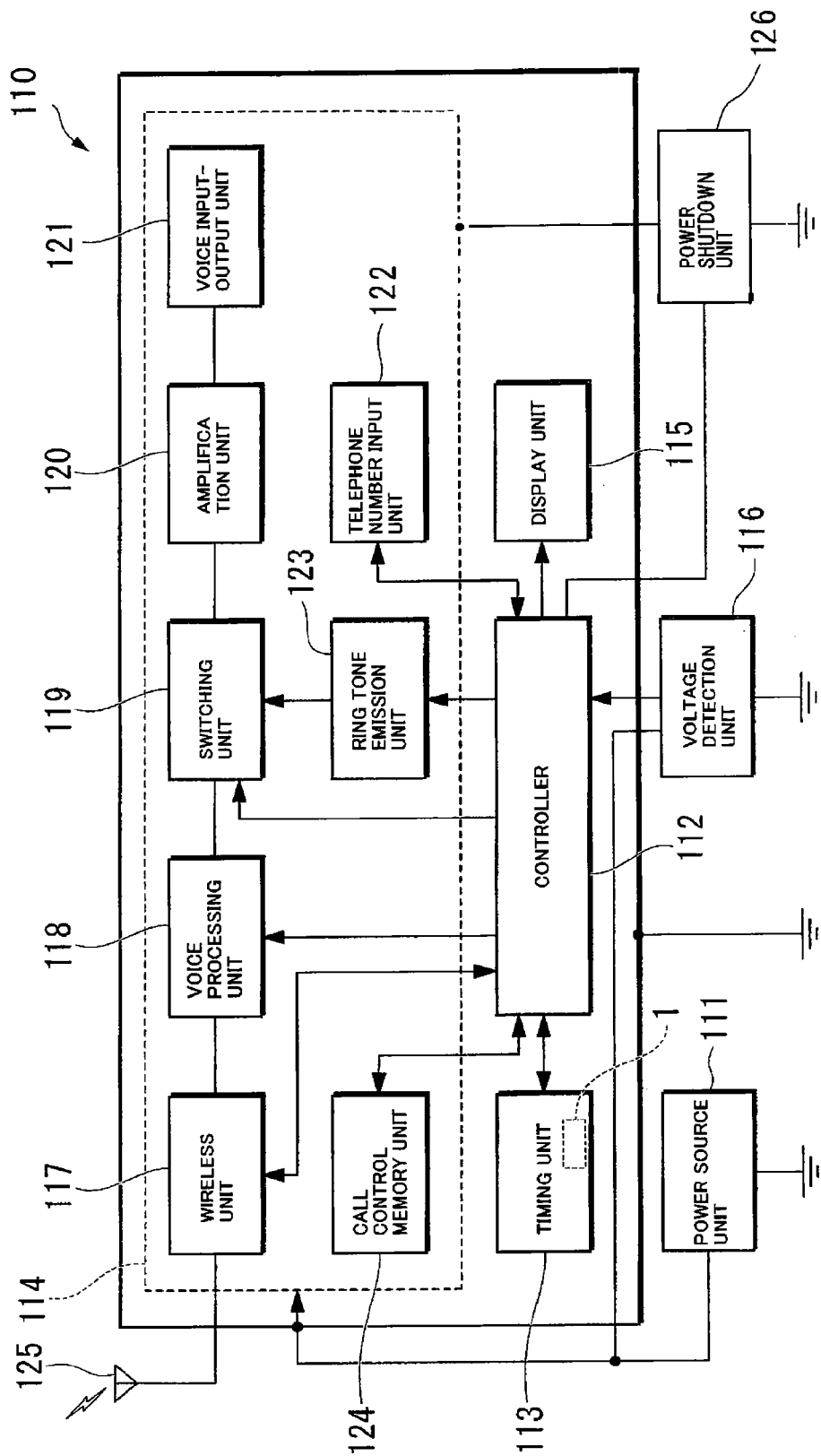
FIG. 23 is a configuration diagram of electronic equipment showing an embodiment of the invention.

As shown in FIG. 23, an oscillator 100 of the present embodiment is constituted as an oscillating element in which the piezoelectric vibrator 1 is electrically connected to an integrated circuit 101. The oscillator 100 includes a substrate 103 on which an electronic component 102 such as a condenser is mounted. The integrated circuit 101 for the oscillator is mounted on the substrate 103, and the piezoelectric vibrating reed 4 of the piezoelectric vibrator 1 is mounted in the vicinity of the integrated circuit 101. The electronic component 102, the integrated circuit 101 and the piezoelectric vibrator 1 are electrically connected to each other by a wiring pattern (not shown), respectively. In addition, the respective constituents are molded by resin (not shown).

In the oscillator 100 configured as above, when the voltage is applied to the piezoelectric vibrator 1, the piezoelectric vibrating reed 4 in the piezoelectric vibrator 1 is vibrated. The vibration is converted to an electric signal by the piezoelectric property of the piezoelectric vibrating reed 4 and input in the integrated circuit 101 as the electric signal. The input electric signal is subjected to the respective processing by the integrated circuit 101 and is output as the frequency signal. As a result, the piezoelectric vibrator 1 functions as the oscillator.

Furthermore, in the configuration of the integrated circuit 101, by selectively setting an RTC (Real Time Clock) module or the like, for example, depending on the demand, the function of controlling the operating date or time of the equipment or external equipment, in addition to the timepiece single function oscillator or the like, or providing the time or the calendar or the like can be added.

As mentioned above, according to the oscillator 100 of the present embodiment, since it includes the piezoelectric vibrator 1 of a high quality whose quality is promoted and whose size is miniaturized, the oscillator 100 itself can also be promoted in quality and miniaturized in size. Additionally, it is possible to obtain the high precision frequency signal that is stable over a long period of time.

Next, an embodiment of the electronic equipment according to the invention will be explained with reference to FIG. 23. Furthermore, as the electronic equipment, portable information equipment 110 having the above-mentioned piezoelectric vibrator 1 will be explained as an example. Firstly, the portable information equipment 110 of the present embodiment is represented by, for example, a mobile phone, and is one in which a wrist watch in the related art is developed and improved. The exterior thereof is similar to a wrist watch, where a liquid crystal display is arranged on a portion equivalent to the hour plate, and the present time or the like can be displayed on the screen. Furthermore, when it is used as a communicator, it can be separated from the wrist and can perform the same communication as the mobile phone of the related art by a speaker and a microphone built in an inner portion of the band. However, as compared to the mobile phone of the related art, it is radically miniaturized and lightened.

Next, the configuration of the portable information equipment 110 of the present embodiment will be explained. As shown in FIG. 23, the portable information equipment 110 includes the piezoelectric vibrator 1 and a power source portion 111 for supplying the electric power. The power source portion 111 includes, for example, a lithium secondary battery. A control portion 112 which performs various controls, a measurement portion 113 performing the count of the time or the like, a communication portion 114 performing the communication with the outside, a display portion 115 displaying various information, and a voltage detection portion 116 detecting the voltage of the respective functional portions are connected to the power source portion 111 in parallel. Moreover, the respective functional portions are provided with the electric power by the power source portion 111.

The control portion 112 controls the respective functional portions to perform the motion control of the whole system such as the transmission and the reception of the sound data, or the measurement or the display of the current time. Furthermore, the control portion 112 includes a ROM with a program written thereon in advance, a CPU that reads and executes the program written on the ROM, and a RAM or the like used as a work area of the CPU.

The measurement portion 113 includes an integrated circuit, which is equipped with an oscillation circuit, a resistor circuit, a counter circuit, interface circuit or the like, and the piezoelectric vibrator 1. When the voltage is applied to the piezoelectric vibrator 1, the piezoelectric vibrating reed 4 is vibrated and the vibration is converted to the electric signal by the piezoelectric property of crystal, and is input to the oscillation circuit as the electric signal. The output of the oscillation circuit is binarized and is counted by the resister circuit and the counter circuit. Moreover, the signal is transmitted to and received from the control portion 112 via the interface circuit, and the current time, the current date, the calendar information or the like is displayed on the display portion 115.

The communication portion 114 has the same function as the mobile phone of the related art, and includes a wireless portion 117, a sound processing portion 118, a switch-over portion 119, an amplification portion 120, a sound input and output portion 121, a phone number input portion 122, a receiving sound generation portion 123, and a call control memory portion 124.

The wireless portion 117 performs the exchange of the transmission and the reception of various data such as sound data with a base station via an antenna 125. The sound processing portion 118 encodes and decrypts the sound signal input from the wireless portion 117 or the amplification portion 120. The amplification portion 120 amplifies the signal, which is input from the sound processing portion 118 or the sound input and output portion 121, to a predetermined level. The sound input and output portion 121 includes a speaker, a microphone or the like, amplifies the receiving sound or the receipt sound, or collect the sound.

Furthermore, the receiving sound generation portion 123 creates the receiving sound according to calls from the base station. The switch-over portion 119 switches the amplification portion 120 connected to the sound processing portion 118 to the receiving sound generation portion 123 only when receiving, whereby the receiving sound created in the receiving sound generation portion 123 is output to the sound input and output portion 121 via the amplification portion 120.

In addition, the call control memory portion 124 stores the program relating to the departure and the arrival of the communication. Furthermore, the phone number input portion 122 includes, for example, number keys from 0 to 9 and other keys, and by pushing the number keys or the like, the phone number of the call destination or the like is input.

The voltage detection portion 116 detects the voltage drop and notifies it to the control portion 112 when the voltage added to the respective function portions such as the control portion 112 by the power source portion 111 is lower than a predetermined value. The predetermined voltage value of this time is a value which is preset as a minimum voltage necessary for stably operating the communication portion 114, and, for example, is about 3V. The control portion 112 receiving notification of a voltage drop from the voltage detection portion 116 prohibits the operation of the wireless portion 117, the sound processing portion 118, the switch-over portion 119 and the receiving sound generation portion 123. Particularly, stopping the operation of the wireless portion 117 having a high rate of electric power consumption is essential. Furthermore, the intent that the communication portion 114 becomes unusable due to the lack of the battery residual quantity is displayed on the display portion 115.

That is, the operation of the communication portion 114 can be prohibited by the voltage detection portion 116 and the control portion 112 and the intent can be displayed on the display portion 115. The display may be a text message, but as a more intuitive display, an X (cross) display may be made on a phone icon displayed on the upper portion of the display surface of the display portion 115.

In addition, the power source shut-off portion 126 which can selectively shut off the power source of the portion relating to the function of the communication portion 114 is included, whereby the function of the communication portion 114 can further reliably be stopped.

As mentioned above, according to the portable information equipment 110 of the present embodiment, since it includes the piezoelectric vibrator 1 whose quality is promoted and whose size is miniaturized, the portable information equipment itself also can be promoted in quality and miniaturized in size. Additionally, it is possible to display the high precision timepiece information which is stable for a long period of time.

Next, an embodiment of a radio-controlled timepiece according to the invention will be explained with reference to FIG. 24.

Figure 24:
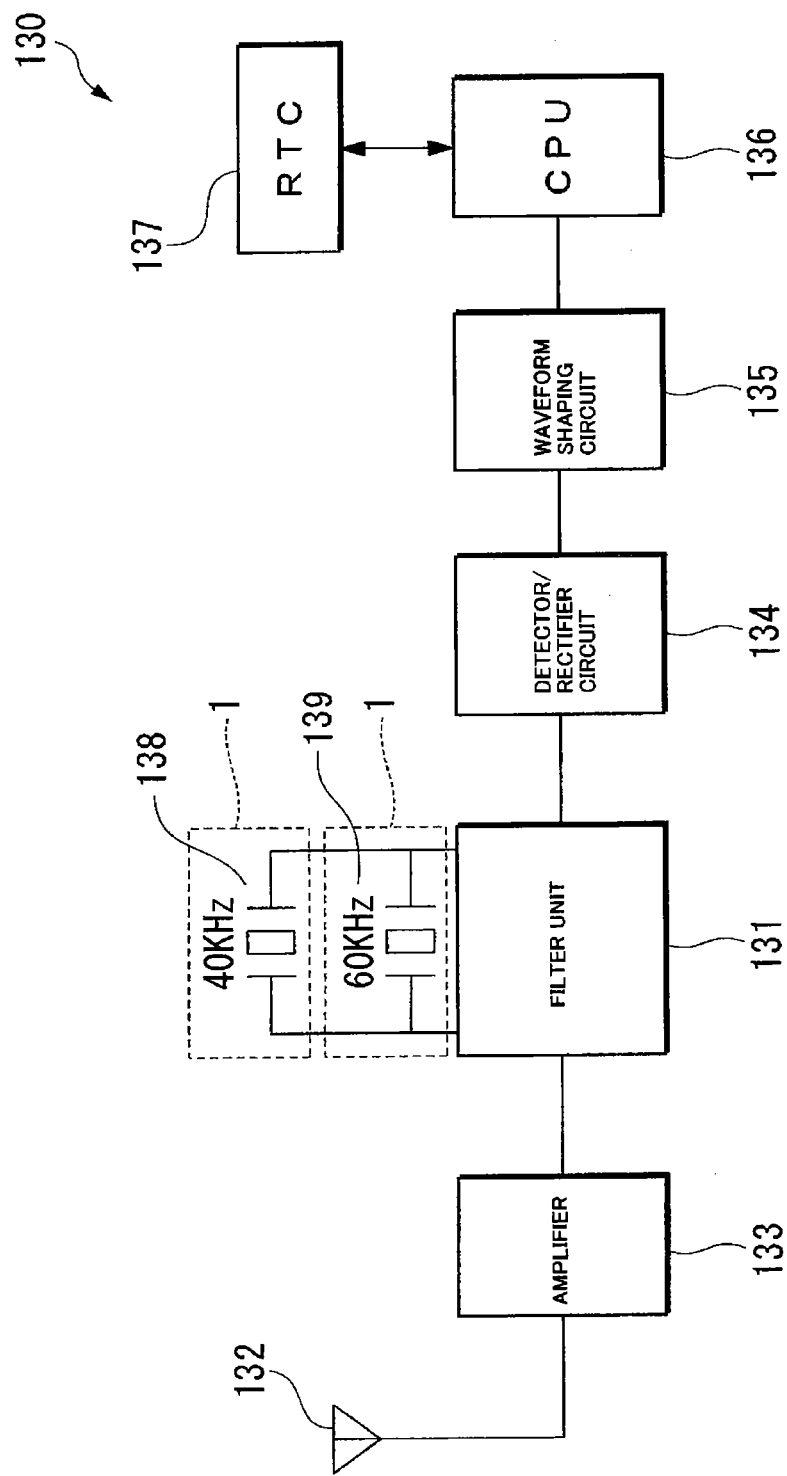
FIG. 24 is a configuration diagram of a radio-controlled timepiece showing an embodiment of the invention.

As shown in FIG. 24, a radio-controlled timepiece 130 of the present embodiment is a timepiece which includes the piezoelectric vibrator 1 that is electrically connected to a filter portion 131 and includes the function of receiving standard radio waves including the timepiece information and automatically correcting and displaying the same as the correct time.

In Japan, transmitting stations for transmitting standard radio waves exist in Fukushima prefecture (40 KHz) and Saga prefecture (60 KHz), and each transmits the standard radio waves, respectively. Since long waves such as 40 KHz or 60 KHz have a property of spreading across the surface of the earth and a property of spreading while reflecting between the ionization layer and the surface of the earth, the spreading range is wide, and the above-mentioned two transmitting stations cover the whole of Japan.

Hereinafter, a functional configuration of the radio-controlled timepiece 130 will be explained in detail.

An antenna 132 receives the standard radio waves of the long waves at 40 KHz or 60 KHz. The standard radio waves of the long waves apply an AM modulation to the transport waves of 40 KHz or 60 KHz in a time information called a time code. The standard radio waves of the received long waves are amplified by an amp 133 and are filtered and tuned by a filter portion 131 having a plurality of piezoelectric vibrators 1.

The piezoelectric vibrator 1 of the present embodiment includes crystal vibrator portions 138 and 139 having the same resonant frequencies of 40 KHz and 60 KHz as the transport frequency, respectively.

The signal of the filtered predetermined frequency is detected and demodulated by a detection and rectifier circuit 134. Next, the time code is taken out via a wave shaping circuit 135 and is counted by a CPU 136. In the CPU 136, information such as current year, accumulated date, day of the week, and time is read. The read information is reflected in an RTC 137 and the correct time information is displayed.

Since the transport waves are 40 KHz or 60 KHz, a vibrator having the above-mentioned tuning fork type structure is suitable for the crystal vibrator portions 138 and 139.

In addition, the aforementioned explanation was shown by an example in Japan, but the frequencies of the standard radio waves of the long waves differ in foreign countries. For example, standard radio waves of 77.5 KHz are used in Germany. Thus, in a case where the radio-controlled timepiece 130 capable of coping in foreign countries is built in a mobile phone, there is a need for the piezoelectric vibrator 1 having a different frequency from the case in Japan.

As mentioned above, according to the radio-controlled timepiece 130 of the present embodiment, since it includes the piezoelectric vibrator 1 whose quality is promoted and whose size is miniaturized, the radio-controlled timepiece itself can also be promoted in quality and miniaturized in size. Additionally, it is possible to stably and accurately count the time over a long period of time.

In addition, the technical scope of the invention is not limited to the above embodiments but various modifications can be added within a scope without departing from the gist of the invention.

Figure 25:
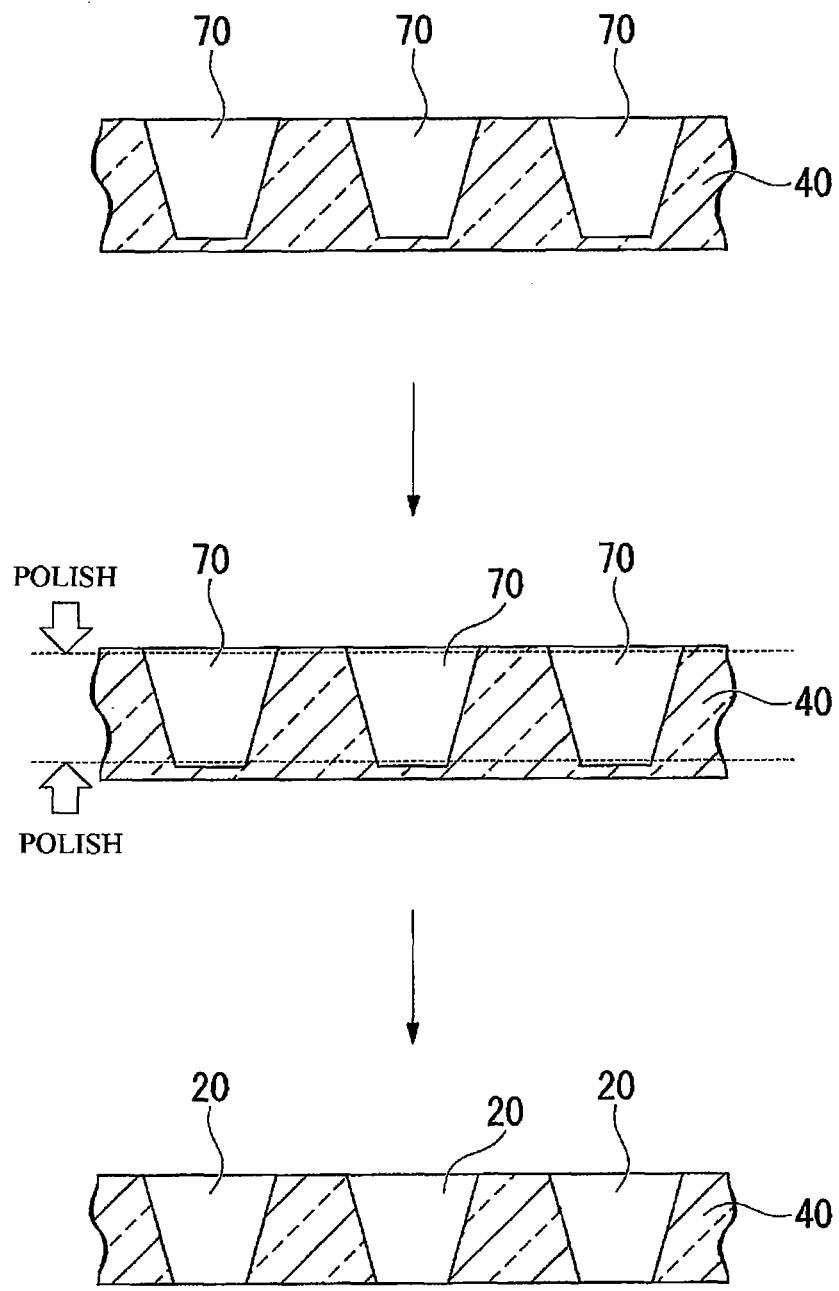
FIG. 25 is a process diagram showing a modified example of a method of manufacturing a piezoelectric vibrator according to the invention.
Figure 26:
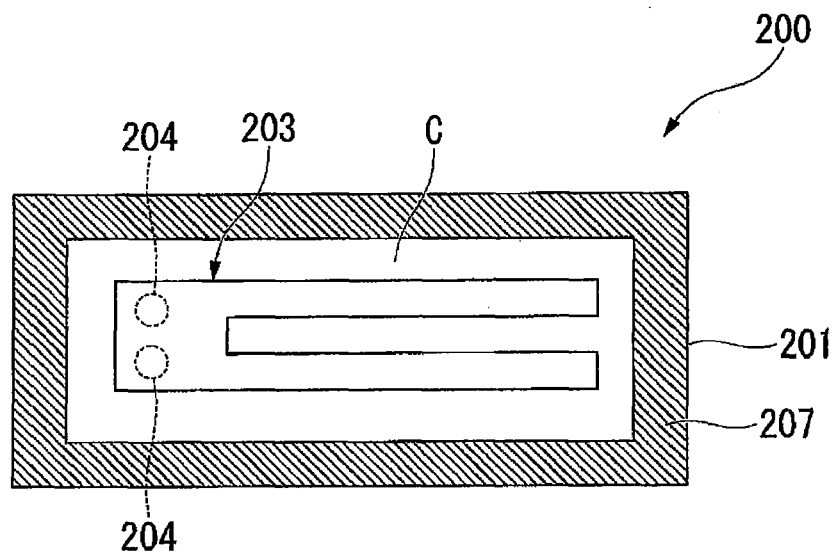
FIG. 26 is an inner configuration diagram of the piezoelectric vibrator of the related art which shows the piezoelectric vibrating reed from the upper part with the lid substrate detached.
Figure 27:
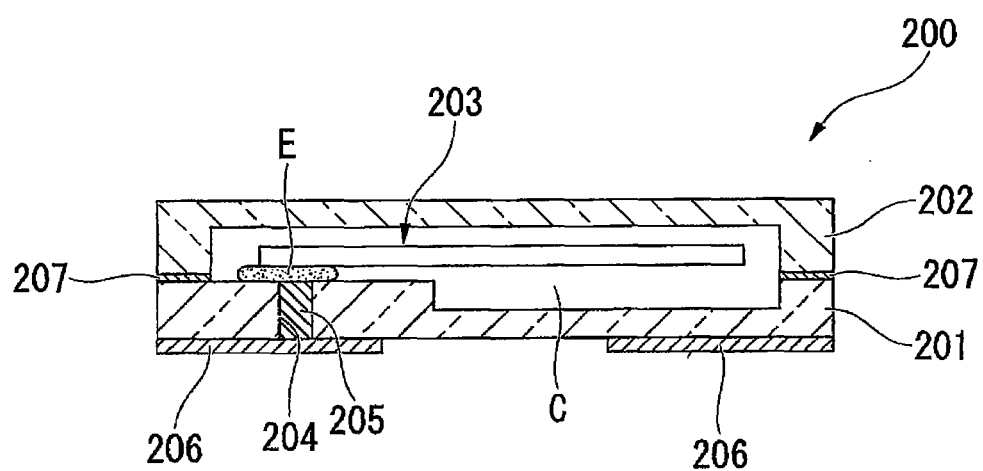
FIG. 27 is a cross-sectional view of the piezoelectric vibrator shown in FIG. 26.

For example, in the above-mentioned embodiment, when forming the through hole 20, as shown in FIG. 25, the concave portion 70 may first be formed in the base substrate wafer 40 by the press molding and then both surfaces of the base substrate wafer 40 may be polished, thereby forming the through hole 20.

Furthermore, in the above-mentioned embodiments, as an example of the piezoelectric vibrating reed 4, the piezoelectric vibrating reed 4 with grooves in which the groove portions 15 are formed on both surfaces of the vibration arm portions 10 and 11 is described, but it may be a type of piezoelectric vibrating reed without the groove portions 15. However, by forming the grove portions 15, when a predetermined voltage is applied to the pair of excitation electrodes 13, the electric field efficiency between the pair of excitation electrodes 13 can be improved, which can further suppress the vibration loss and further improve the vibration property. That is, the CI value (Crystal Impedance) can be further reduced and the high performance of the piezoelectric vibrating reed 4 can be further promoted. Given this point, it is desirable to form the groove portions 15.

Furthermore, while in the above-mentioned embodiments the tuning fork type piezoelectric vibrating reed 4 is explained as an example, the invention is not limited to the tuning folk type. For example, a thick sliding vibrating reed may be used.

Moreover, while in the above-mentioned embodiments, the base substrate 2 and the lid substrate 3 were anode-bonded to each other via the bonding film 22, the invention is not limited to anode-bonding. However, anode-bonding is desirable in that both substrates 2 and 3 can strongly be bonded to each other by performing the anode-bonding.

Moreover, while in the above-mentioned embodiment the piezoelectric vibrating reed 4 is bump-bonded, it is not limited to the bump-bonding. For example, the piezoelectric vibrating reed 4 may be bonded by a conductive adhesive. However, the piezoelectric vibrating reed 4 can float from the upper surface of the base substrate 2 by bump-bonding, whereby it is possible to naturally secure the minimum vibration gap that is necessary for the vibration. Thus, the bump-bonding is desirable in this point.

What is claimed is:

1. A method of manufacturing a plurality of piezoelectric vibrators, in which a piezoelectric vibrating reed is sealed in a cavity formed between a base substrate and a lid substrate bonded to each other, at a time using a base substrate wafer and a lid substrate wafer, comprising:

a setting process in which, after preparing a forming mold including a lower mold and an upper mold having a pin, which protrudes toward the lower mold and has a taper-shaped section in which a taper angle is in a range of 15 degree or more and 20 degree or less, the base substrate wafer is set between the lower mold and the upper mold;

a pressing process in which the upper mold and the lower mold are press-molded in a state in which the base substrate wafer is heated to a predetermined temperature and is softened, and a through hole is formed in the base substrate wafer using the pin;

a baking process in which, after the base substrate wafer is subjected to a cooling solidification, the through hole is blocked by burying the conductive paste in the through hole, and then, the conductive paste is baked to a predetermined temperature and is hardened, thereby forming a through electrode of a taper-shaped section;

a mounting process in which the piezoelectric vibrating reed is bonded to an upper surface of the base substrate wafer so as to be electrically connected to the through electrode;

a bonding process in which the base substrate wafer and the lid substrate wafer are overlapped and bonded with each other, thereby sealing the piezoelectric vibrating reed in the cavity;

an external electrode forming process in which an external electrode is formed on a lower surface of the base substrate wafer so as to be electrically connected to the through electrode; and a cutting process in which both of the bonded wafers are cut to form a plurality of small pieces of the piezoelectric vibrators.

2. A piezoelectric vibrator comprising:

a base substrate and a lid substrate which are connected to each other and have a cavity formed therebetween;

a piezoelectric vibrating reed that is mounted on the base substrate in the cavity;

an external electrode that is formed on a lower surface of the base substrate; and a through electrode which is formed so as to pass through the base substrate, maintains the airtightness in the cavity, and electrically connects the piezoelectric vibrating reed with the external electrode, wherein the through electrode is formed by a press molding by a forming mold having a pin, and includes a through hole of a taper-shaped section, in which a taper angle is in the range of 15° or more and 20° or less, and a conductive paste that is hardened after being filled in the through hole.

3. An oscillator in which the piezoelectric vibrator according to claim 1 is electrically connected to an integrated circuit as an oscillating element.

4. Electronic equipment in which the piezoelectric vibrator according to claim 1 is electrically connected to a measurement portion.

5. A radio-controlled timepiece in which the piezoelectric vibrator according to claim 1 is electrically connected to a filter portion.

\* \* \* \* \*

UNITED STATES PATENT AND TRADEMARK OFFICE
CERTIFICATE OF CORRECTION

PATENT NO. : 8,421,546 B2
APPLICATION NO. : 13/035490
DATED : April 16, 2013
INVENTOR(S) : Kazuyoshi Sugama et al.

It is certified that error appears in the above-identified patent and that said Letters Patent is hereby corrected as shown below:

On the Title Page, Item (54) and in the Specification, Column 1, Line 1, Title after:

"PIEZOELECTRIC VIBRATOR, OSCILLATOR, ELECTRONIC" replace "EQUIPMENT TIMEPIECE, AND RADIO-CONTROLLED" with
--EQUIPMENT AND RADIO-CONTROLLED--.

Signed and Sealed this
Fifteenth Day of October, 2013

Teresa Stanek Rea
*Deputy Director of the United States Patent and Trademark Office*